US010757522B2

(12) United States Patent
Mäkivirta et al.

(10) Patent No.: US 10,757,522 B2
(45) Date of Patent: Aug. 25, 2020

(54) ACTIVE MONITORING HEADPHONE AND A METHOD FOR CALIBRATING THE SAME

(71) Applicant: Genelec Oy, Iisalmi (FI)

(72) Inventors: Aki Mäkivirta, Iisalmi (FI); Siamäk Naghian, Iisalmi (FI)

(73) Assignee: Genelec Oy, Iisalmi (FI)

( * ) Notice: Subject to any disclaimer, the term of this patent is extended or adjusted under 35 U.S.C. 154(b) by 0 days.

(21) Appl. No.: 16/094,890

(22) PCT Filed: Apr. 19, 2017

(86) PCT No.: PCT/FI2017/050297
§ 371 (c)(1),
(2) Date: Oct. 19, 2018

(87) PCT Pub. No.: WO2017/182715
PCT Pub. Date: Oct. 26, 2017

(65) Prior Publication Data

US 2019/0098426 A1 Mar. 28, 2019

(30) Foreign Application Priority Data

Apr. 20, 2016 (FI) ..................................... 20165346

(51) Int. Cl.
*H04R 5/033* (2006.01)
*H04R 29/00* (2006.01)
(Continued)

(52) U.S. Cl.
CPC ............... *H04S 7/301* (2013.01); *H04R 3/04* (2013.01); *H04R 5/033* (2013.01); *H04R 5/04* (2013.01); *H04R 29/00* (2013.01); *H04R 29/001* (2013.01); *H04S 7/304* (2013.01); *H04S 7/308* (2013.01); *H04R 2420/05* (2013.01); *H04R 2420/09* (2013.01); *H04S 2420/01* (2013.01)

(58) Field of Classification Search
CPC ............ H04R 2420/05; H04R 2420/09; H04R 29/00; H04R 29/001; H04R 3/04; H04R 5/033; H04R 5/04; H04S 2420/01; H04S 7/301; H04S 7/304; H04S 7/308
USPC .............................. 381/57, 59, 71.6, 74, 309
See application file for complete search history.

(56) References Cited

U.S. PATENT DOCUMENTS 9,590,580 B1 * 3/2017 You ........................ H03G 7/008
2005/0124375 A1 * 6/2005 Nowosielski .......... A61B 3/032
455/550.1

(Continued)

FOREIGN PATENT DOCUMENTS

JP 2006041569 A 2/2006
JP 2008283564 A 11/2008

(Continued)

*Primary Examiner* — Vivian C Chin
*Assistant Examiner* — Friedrich Fahnert
(74) *Attorney, Agent, or Firm* — Laine IP Oy

(57) ABSTRACT

According to an example aspect of the present invention, there is provided a method for calibrating a headphone including an amplifier with a memory and signal processing properties, the method comprising steps for determining a desired sound attributes for the headphone, and setting signal processing parameters in the amplifier in order to obtain the desired sound attributes either by measurement or based on the received input information from a user of the headphones.

21 Claims, 15 Drawing Sheets

(51) Int. Cl.

| | |
|---|---|
| ***H04R 3/04*** | (2006.01) |
| ***H04R 5/04*** | (2006.01) |
| ***H04S 7/00*** | (2006.01) |

(56) References Cited

U.S. PATENT DOCUMENTS

| | | | | |
|---|---|---|---|---|
| 2006/0045294 | A1 | 3/2006 | Smyth | |
| 2006/0093159 | A1 | 5/2006 | Koh et al. | |
| 2007/0109977 | A1* | 5/2007 | Mittal | G10L 21/038 370/260 |
| 2008/0004866 | A1* | 1/2008 | Virolainen | G10L 19/008 704/205 |
| 2010/0191143 | A1* | 7/2010 | Ganter | A61B 5/121 600/559 |
| 2010/0303250 | A1* | 12/2010 | Goldberg | H04R 29/001 381/59 |
| 2012/0063611 | A1* | 3/2012 | Kimura | H04R 1/1083 381/71.6 |
| 2013/0003981 | A1 | 1/2013 | Lane | |
| 2013/0094660 | A1* | 4/2013 | Weinstein | H04R 1/10 381/74 |
| 2013/0236023 | A1 | 9/2013 | Horbach | |
| 2014/0369519 | A1 | 12/2014 | Leschka et al. | |
| 2015/0104036 | A1 | 4/2015 | Mori et al. | |
| 2015/0280677 | A1* | 10/2015 | Hui | H03G 7/007 381/57 |
| 2016/0329867 | A1* | 11/2016 | Lesso | H03F 1/3241 |
| 2017/0094412 | A1* | 3/2017 | Mattana | H04R 5/04 |

FOREIGN PATENT DOCUMENTS

| | | | | |
|---|---|---|---|---|
| JP | 2013526798 | A | 6/2011 | |
| JP | 2015126268 | A | 7/2015 | |
| JP | 2018555466 | A | 6/2019 | |
| JP | 2019516313 | A | 6/2019 | |
| WO | WO2006024850 | A2 | 3/2006 | |
| WO | WO2011142722 | A1 | 11/2011 | |
| WO | WO2013124490 | A2 | 8/2013 | |
| WO | WO-2015128390 | A1 * | 9/2015 | H04R 29/001 |
| WO | WO2015128390 | A1 | 9/2015 | |
| WO | WO2016071221 | A1 | 5/2016 | |
| WO | WO2017182707 | A1 | 10/2017 | |

* cited by examiner

| Method | $\alpha$ | $\sigma^2$ | Smoothing factor |
|---|---|---|---|
| WI | Eq. 7 | 0 | ... |
| RI | $Eq.6\beta$ | $\beta$ | -- |
| SM | Eq. 6 | 0 | half-octave |
| SI | Eq. 6/Eq. 7 | Eq. 8 | half-octave |
Fig. 13
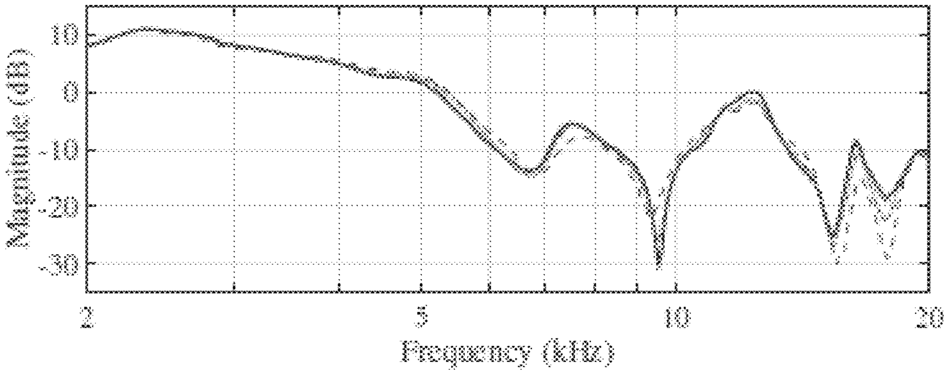
Fig. 14
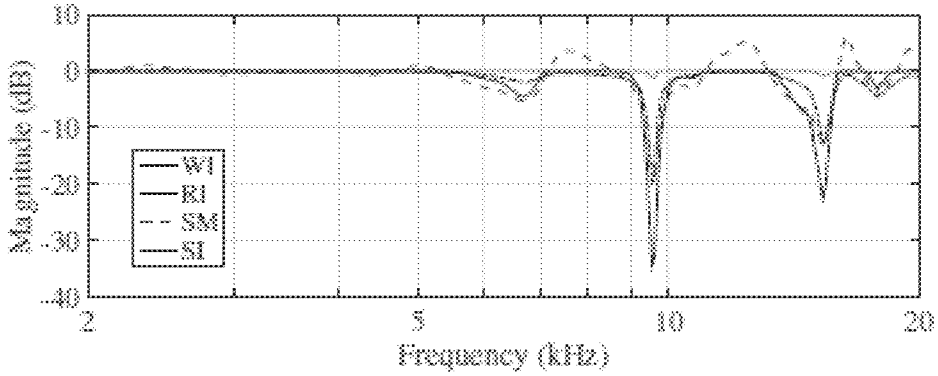
Fig. 15

| Method | $\mu$ | SD |
|---|---|---|
| NF | 19.95 | 19.45 |
| RI | 79.8 | 14.33 |
| SM | 69.62 | 25.7 |
| SI | 89.62 | 8.04 |

| Method | RI | NF | SM |
|---|---|---|---|
| SI | .002 | < .001 | < .001 |
| SM | .139 | < .001 | – |
| NF | < .001 | ... | ... |

| $(Z/p)$ | Direct | $H_{bin}$ | $H_{binEQ}$ | $H_{phEQ}$ |
|---|---|---|---|---|
| $H_{bin}$ | 9.25/0 | – | – | – |
| $H_{binEQ}$ | 7.9/0 | 8.55/0 | – | – |
| $H_{phEQ}$ | 7.12/0 | 8.97/0 | 4.03/0 | – |
| $H_{roomEQ}$ | 5.69/0 | 9.25/0 | 6.36/0 | 3.23/0 |

| $(Z/p)$ | Direct | $H_{bin}$ | $H_{binEQ}$ | $H_{phEQ}$ |
|---|---|---|---|---|
| $H_{bin}$ | 9.393/0 | – | – | – |
| $H_{binEQ}$ | 9.396/0 | 6.98/0 | – | – |
| $H_{phEQ}$ | 9.25/0 | 7.28/0 | **0.915/0.845** | – |
| $H_{roomEQ}$ | 8.83/0 | 8.5/0 | 4.05/0 | 4.33/0 |

| $(Z/p)$ | Direct | $H_{\text{bin}}$ | $H_{\text{binEQ}}$ | $H_{\text{phEQ}}$ |
|---|---|---|---|---|
| $H_{\text{bin}}$ | **0.77/0.43** | – | – | – |
| $H_{\text{binEQ}}$ | 6.88/0 | 7.49/0 | – | – |
| $H_{\text{phEQ}}$ | 6.68/0 | 7.44/0 | **0.87/0.38** | – |
| $H_{\text{roomEQ}}$ | 3.78/0 | 4.34/0 | 5.58/0 | 5.22/0 |

ACTIVE MONITORING HEADPHONE AND A METHOD FOR CALIBRATING THE SAME

FIELD

The invention relates to active monitoring headphones and methods relating to these headphones.

BACKGROUND

Most headphones are passive, therefore the performance depends on the external amplifier that is used. Therefore, the performance varies a lot from unit to unit and from design to design. There are some active headphones with electronics built into the earphone cups. Electronics is taking space and reducing acoustic performance (often). Electronic functions are just amplifier, or amplifier and ANC (Active Noise Cancellation). Getting the necessary interfaces for computer/digital audio/analog audio is expensive. There are two types of headphones: open and closed headphones. While the open headphones have their own advantages they have poor attenuation for the environmental noise and this can prevent hearing of details in the audio material (and the environment acoustics may even affect the audio of the headphones), but the open headphone design is said to avoid the "box" sound (audio colorations) and limited low frequency extension sometimes associated with the closed headphones design. Also in the closed headphone the user hearing is limited to the ear cup area and therefore communicating between users might be a challenging.

When the headphones are used to complement and continue the work also done using loudspeakers there is a need to design headphone and the associated signal processing such that the calibration of the headphone has the same sound character as a the sound of the loudspeaker based monitor system in a room so that the sound quality could stay consistent when switching from one system to another.

SUMMARY OF THE INVENTION

The invention relates to Active Monitoring Headphones (AMH) and their calibration methods.

The invention is defined by the features of the independent claims. Some specific embodiments are defined in the dependent claims.

According to a first aspect of the present invention, there is provided a method for auto calibrating an active monitoring headphone including an amplifier with a memory and signal processing properties, the method comprising steps for determining a desired sound attributes for the headphone (1), setting signal processing parameters and calibration algorithms in the amplifier (2) in order to obtain the desired sound attributes either by measurement or based on the received input information from a user of the headphones.

According to second aspect of the present invention, there is provided a method wherein the sound attributes include at least one of the following features: "frequency response", "temporal response", "phase response" or "sound level".

According to third aspect of the present invention, there is provided method wherein the desired sound attributes like frequency response is determined based on calibration parameters of a loudspeaker system for a specific room and according acoustical measurements in the room.

According to fourth aspect of the present invention, there is provided a method, wherein a test signal is initiated via the software or hardware interface, generated by the amplifier or interface device and reproduced by loudspeakers through a first sub-band ($B_1$), the testsignal is reproduced by headphones (1) through the first sub-band ($B_1$), evaluating the sound attributes like sound level of the test signal reproduced by the headphones (1) through the first sub-band ($B_1$) with the test signal reproduced by the loudspeakers through the first sub band ($B_1$) and setting and storing the sound attributes like sound level of the headphones to be essentially the same as in the loudspeakers at the sub-band $B_1$, repeating the above procedure with the test signal through several sub-bands $B_1$-$B_n$.

According to fifth aspect of the present invention, there is provided method wherein the test signal is pink noise.

According to sixth aspect of the present invention, there is provided wherein the test signal a music-like audio file including audio signals with wide spectrum content.

According to seventh aspect of the present invention, there is provided method wherein the duration of the test signal is 1-10 seconds.

According to eighth aspect of the present invention, there is provided wherein the the test signal is repeated continuously.

According to a ninth aspect of the present invention, there is provided an active monitoring headphone system including headphones and an amplifier connected to the headphones by a cable, the system comprising circumaural ear cups, means for signal processing in the amplifier (2) means for storing at least two predefined equalization settings in the amplifier (2), and means for noise cancelling in frequencies below 200 Hz.

According to tenth aspect of the present invention, there is provided an active headphone system wherein the headphones and the headphone amplifier are separate independent units connected to each other by a cable.

According to eleventh aspect of the present invention, there is provided an active headphone system wherein each driver or ear cup of the headphone is factory calibrated against a set reference ear cup or driver and stored in a memory of the amplifier, whereby the factory calibration makes all of the ear cups in the headphone system acoustically essentially the same, e.g. same response, same loudness based on set reference ear cup or driver.

According to eleventh aspect of the present invention, there is provided an active headphone system wherein the headphone amplifier and the headphone are a unique pair based on the factory calibration.

The claimed invention relates to the technical effect how to equalize sound for a transducer (driver) from first listening environment (loudspeakers) to second listening environment (headphones) by minimal variation in physical sound reproduction in the close proximity of the ear.

In other words the invention creates a technical solution how to equalize sound information created for loudspeakers to headphone drivers with minimal variation at the ears of the listener.

BRIEF DESCRIPTION OF THE DRAWINGS

FIG. 13 illustrates a table showing parameters for Eq. 9 to obtain the inverse of a headphone response using Wiener deconvolution (WI), conventional regularized inverse (RI), complex smoothing (SM), and proposed method sigma inversion (SI) methods.

FIG. 14 illustrates a normalized magnitude responses of a headphone measured four times and repositioning the headphone between measurements. The subject removed and reapplied the headphones himself before each measurement. The first measurement is used for inversion (solid line). The other three responses are denoted by dotted, dash-dotted and dashed lines. There are no noticeable differences at frequencies below 2 kHz.

FIG. 15 illustrates the effect of compensating a single headphone response using the inverse filters obtained with Wiener deconvolution (WI), conventional regularized inverse method (RI), complex smoothing method (SM), and proposed sigma inversion method (SI). There are no noticeable differences for frequencies below 2 kHz.

EMBODIMENTS

Definitions

In the present context, the term "audio frequency range" is the frequency range from 20 Hz to 20 kHz.

In the present context, the term “sub-band” $B_n$, means a passband within the audio frequency range narrower than the audio frequency range.

In the present context, the definition of “evaluating the sound characteristics” means either measurement by using a microphone or subjective determination by a person.

In the present context, the definition of “sound attribute” includes definitions “frequency response”, “temporal response”, “phase response”, “volume level” and “frequency emphasis within a sub-band”.

When the headphones are used to complement and continue the monitoring work also done using loudspeakers there is a need to design headphone and the associated signal processing such that the calibration of the headphone has the same sound character as a the sound of the loudspeaker based monitor system in a room. This is necessary to ensure that the monitoring quality remains consistent as much as possible when switching from one monitoring system to another.

Figure 1:
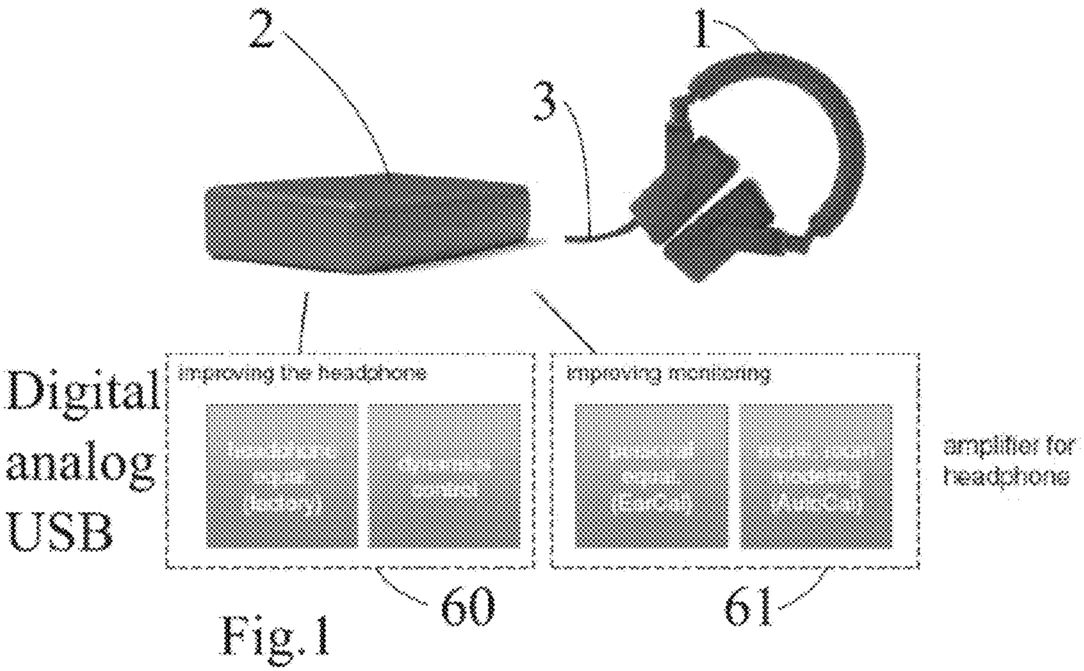
FIG. 1 illustrates one active headphone in accordance with at least some embodiments of the present invention.

FIG. 1 illustrates one active monitoring headphone in accordance with at least some embodiments of the present invention, where an active monitoring stereo headphone 1 with drivers for both ears is connected to a headphone amplifier 2 with help of a connection cable 3. Block 60 describes features of this embodiment, namely the factory calibration where each driver of the headphone 1 is electronically equalized against the said reference to render the driver system for each ear individually to have the same response as the reference, removing any differences between the driver systems for each ear as well as dynamics control where the user is protected from too high sound levels in accordance with at least some embodiments of the present invention. Alternatively the amplifier may also be mechanically integrated into the headphone, whereby the electrical contact between the amplifier and headphone and its drivers is performed by a cable or cables.

In one preferred embodiment the headphone is such that it includes two ear cups each of which surrounds the ear from all sides (circumaural), such that the type of the cup used is closed at the audio frequency range, providing acoustic attenuation to environmental sounds or noises. The connector of the headphone cable according to the invention is a four (or more) pin connector, allowing electronic signals to access each driver inside the headphone separately. Then, the headphone amplifier can individually apply calibration, and also crossover filtering, if more than one driver is used inside each ear cup of the headphone.

Enhanced active LF (Low Frequency) isolation (EAI) uses a microphone attached to the outside or inside of the earphone cup, with additional conductors in the headphone cable, allowing the headphone amplifier to access the microphone signals. The headphone amplifier inverts and amplifies the microphone signal with frequency selective gain, and add this inverted signal to the signal feed into the headphone drivers, such that the noise leaking to the inside of the earphone cup is attenuated or entirely removed. The frequency selective nature of the gain enables this attenuation to work mainly at low frequencies, more specifically at frequencies below 500 Hz. By doing this, the typical reducing passive attenuation of a closed headphone design is enhanced towards low frequencies, producing a headphone that, in combination with the headphone amplifier, attenuates significantly also the low frequencies.

Typically mechanical low frequency sound isolation of a headphone is not good. Some embodiments of the invention may use electronic enhancement to improve LF isolation. The aim is to enable more detailed hearing of the audio details at LF. Typically this enhancement operates below 200 Hz (wavelength 1.7 meters). In the practical implementation at least one earphone cup includes a microphone. The microphone bandwidth is limited, in order to eliminate noise increase in mid ranges. The mic signal is sent back to the headphone amplifier, via the headphone cable. Negative feedback is applied in the analog portion of the amplifier to reduce the Low Frequency level audible inside the earphone. Earphone isolation at low frequencies seems to increase. As a result the apparent sound isolation of the headphone in accordance with the invention seems to be better than in the prior art.

Factory Calibration

In one preferred embodiment factory calibration is used for every driver of the headphone. Factory calibration makes all of the ear cups in the headphones exactly the same, same response, same loudness based on set reference driver or ear cup. This also sets the sensitivity of each earphone cup to exactly the same. The factory calibration is unique for each individual headphone and ear cup of the headphone, therefore the headphone amplifier and the headphone are a unique pair like the amplifier and the enclosure can be for active monitor speakers. Therefore you cannot mix any headphone amplifier with any other active headphone. These factory calibrated headphones form a system with a specific headphone amplifier unit, and they cannot be used with a third-party amplifier or normal headphone output in a device.

Room Calibration, Version 1

Figure 2:
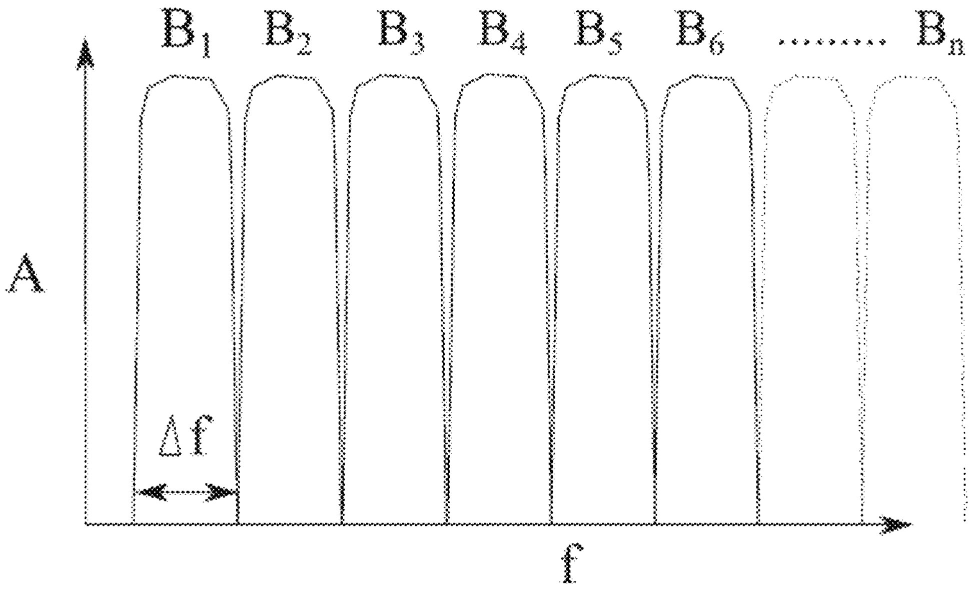
FIG. 2 illustrates a graph how audio signal may be divided into sub-bands in accordance with the invention.
Figure 3:
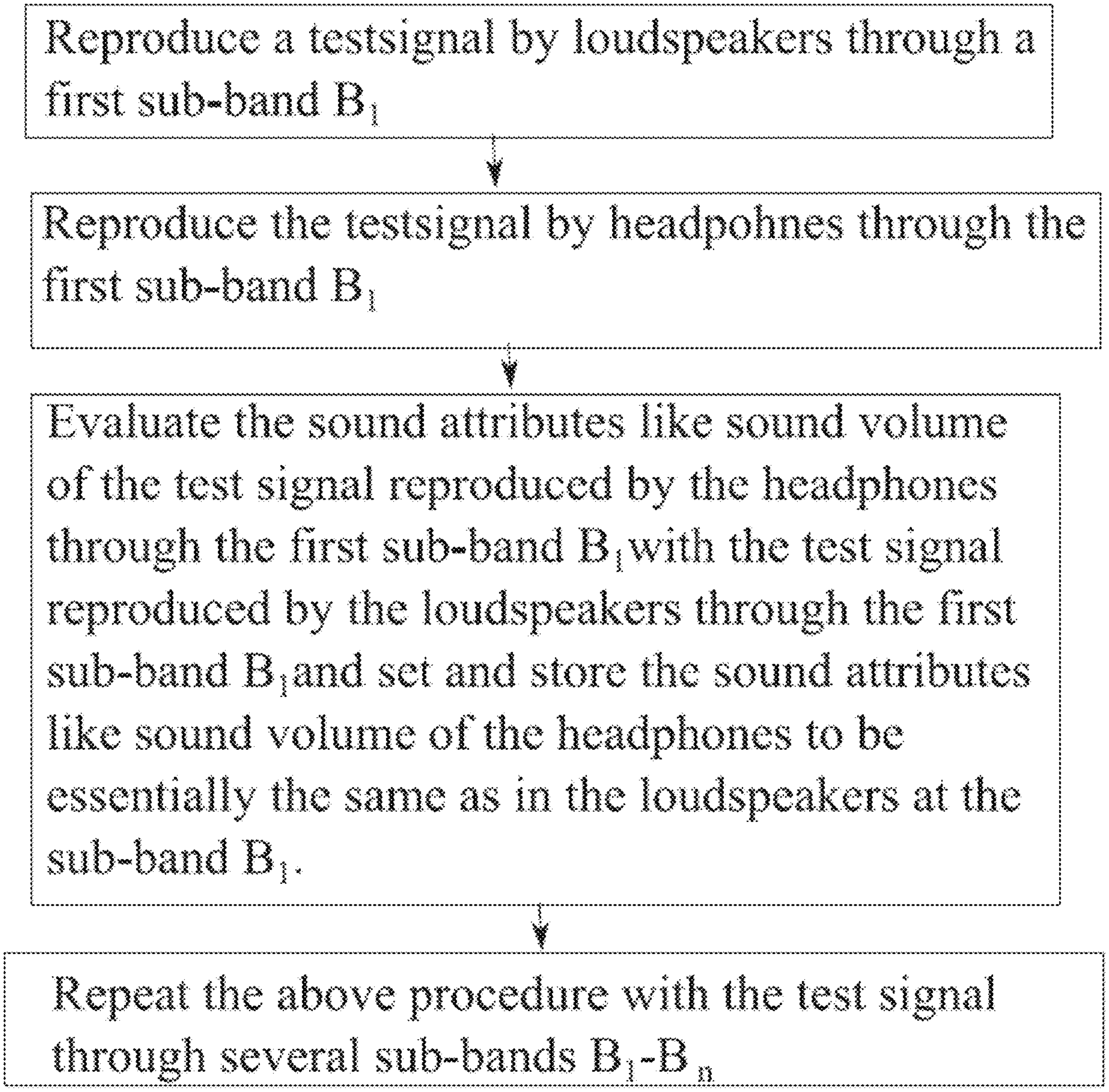
FIG. 3 illustrates as a block diagram one embodiment of one calibration method in accordance with the invention.
Figure 5:
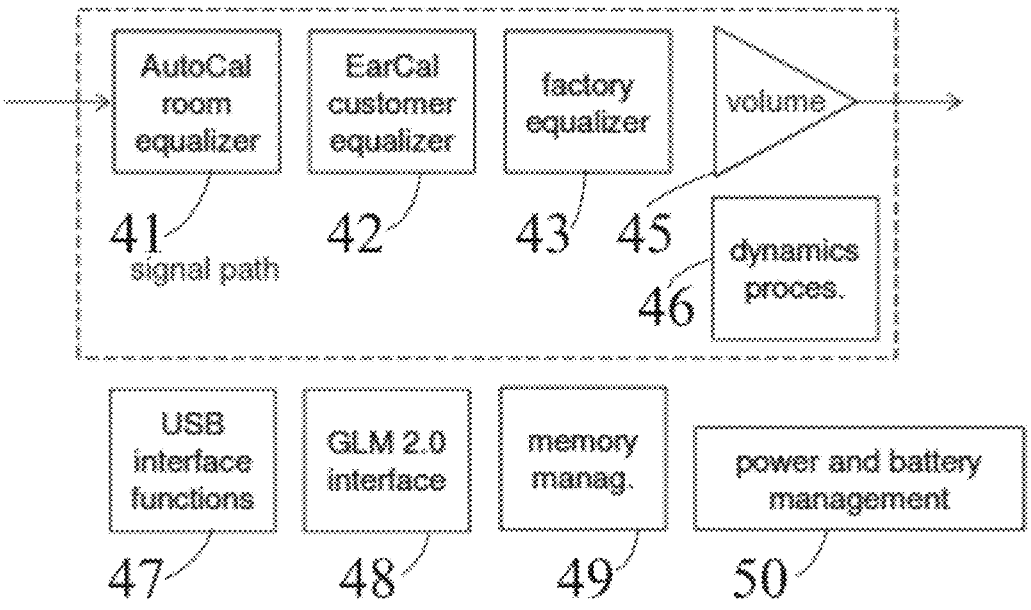
FIG. 5 illustrates as a block diagram one embodiment of the software in accordance with the invention.

This is a method that can be measurement free of room calibrating the headphone sound character. This calibration can be set iteratively by the user in the listening room. Referring to FIG. 5 for the setup and FIGS. 2 and 3 for the method room calibration sets filters in the Active Monitoring Headphone amplifier 2. A software connected to the Active Headphone amplifier 2 provides test signals and shows the progress of the measurement process during the calibration. This is done by a user interface provided in a computer like PC or MAC 51 connected to the headphone amplifier 2. The test signal is fed to the Active headphone amplifier 2 and graphical user interface guides the process. The user adjusts the filter settings in the software by the user interface, effecting the Active Monitoring Headphone amplifier 2 settings such that the sound attributes like sound volume of the test signal is the same as the loudspeaker system. The monitoring loudspeaker system calibration test measurements and equalization setup are used as the reference for adjusting the active monitoring headphone sound attributes. The reference test signal can include a set of different setups based on stored or real time measurements. The user can switch between the monitoring loudspeaker system and the headphone 1 at any time until the software user interface detects that the changes are so small or random, meaning that no systematic improvement is taking place, and this terminates the process. In accordance with FIGS. 2 and 3 the setup procedure steps through the different sub-bands $B_1$-Bn of the audio bandwidth, effecting equalization across the full audio band. This process sets the Active Monitoring Headphone amplifier 2 sound attributes like frequency response similar to the monitoring room sound colour with the loudspeaker system.

In other words the user of the headphones 1 alternates listening to loudspeakers and active monitoring headphones with a test signal across the different frequency ranges. This implies that the test signal is filtered with a band pass filter such that the audio frequency range is divided into several sub-bands $B_1$-$B_n$ in accordance with FIG. 2. The user listens the test signal through several sub-bands $B_1$-$B_n$, adjusts the sound attributes like sound level of the headphones of each sub-band $B_1$-$B_n$ the same as the loudspeaker system with the same band. This evaluation can be made also by measurement using an artificial head including microphones such that the headphones 1 are put on and taken off an artificial head and the output from the microphones in the artificial head are monitors. The procedure continues until there are no essential differences between the monitoring loudspeaker system and the active headphone and then the software stores the settings created by the adjustments into the headphone amplifier as one set of predetermined settings. Typically the bandwidth Δf of a sub-band $B_1$-$B_n$ is one octave. As a sound attribute can also be used frequency adjustment within a sub-band $B_1$-$B_n$ such that either low or high frequencies are emphasized within the sub-band $B_1$-$B_n$.

The test signal is advantageously a way-file including a signal that is a. pink noise, in other words the power spectral density (energy or power per Hz) of the signal is inversely proportional to the frequency of the signal. In pink noise, each octave (halving/doubling in frequency) carries an equal amount of noise power.

b. Alternatively the test signal may be a pseudo sequence of a music-like signal essentially including frequency content spectrally across a wide frequency area, typically covering essentially the frequency ranges of the sub bands.

c. the pseudo sequence can repeat, creating a sample reference for adjustment, and the duration before repetition is typically from 1 to 10 seconds Relating to the user interface this calibration process may be described in the following way:

- the measurement free calibration allows the user to calibrate the sound to be similar in colour (the same sound attributes) to the sound of his loudspeaker system
- the process is based e.g. on sounds that the software generates
- calibration process proceeds in the following way
  - the computer plays a sound sample (this can be a WAV file) for each sub-band
  - this sample is played either in the monitors or in the Active Headphone, under software control
  - software presents a graphical user interface where the user adjusts the level to be similar in the headphone with the monitor system output
  - this is done collectively for the left and right (or surround) system
  - the software advances from one sub-band to the next until all have been covered
  - the user evaluates the outcome and saves the calibration to the Active
- Headphone amplifier 2 memory Room Calibration, Version 2

Alternatively the calibration can be made by measurement. This is a measurement-based method of room calibrating the headphone sound character. This type of room calibration can be set after a software calibration has measured a listening room with help of a monitoring loudspeaker system and a microphone. Here microphone measurements are used in order to determine the Impulse Response of the listening room. The Impulse Response allows calculation of the room frequency response. The room calibration measurements are used to set filters in the Active Monitoring Headphone amplifier 2. This method sets the output signal attributes of the Active Monitoring Headphone amplifier to match with the measured room response. This method models the main features of the room response. The user can select the precision of modeling precision. The room model is an FIR for the first 30 ms and an IIR (Infinite Impulse Response) reverberation model in five sub-bands for the remainder of the room decay. The FIR (Finite Impulse Response) is fitted to the room IR. Sub-band IIRs are fitted to the detected decay character and speed in the sub-band. Externalization filter is typically applied. No user interaction is required.

In connection with the externalization the following procedure is one option in connection with the invention: The Externalization filter is implemented as a binaural filter such that it is an allpass-filter. In other words a filter having a constant magnitude response (magnitude/amplitude does not change as a function of frequency) but only the phase response of the binaural filter is implemented. This kind or a filter can be implemented advantageously as a FIR-filter, but in theory the same result may be obtained as a IIR-filter. Because of the high degree of the filter, IIR implementation is not always practical. With this approach some advantages are gained: if the inversion of the magnitude is modeled with a normal binaural filter, clearly audible coloration is easily created. This can be avoided with the all-pass implementation in accordance with the invention. In addition the all-pass solution never causes big gain, whereby the requirements in dynamics are minimal. The all-pass implementation creates an externalization having an experience of the space where the measurement was made. In addition, the all-pass implementation is not as sensitive to the form of the HRTF-filter as a normal binaural filter, whereby also measurements made with a head of a third person can be used. As a consequence the user may be offered default-externalisation filters corresponding closest the used listening space.

This room calibration may be performed for loudspeakers e.g. in the following way:

A factory-calibrated acoustic measurement microphone is used for aligning sound levels and compensating distance differences for each loudspeaker. Suitable software provides accurate graphical display of the measured response, filter compensation and the resulting system response for each loudspeaker, with full manual control of acoustic settings. Single or multi point microphone positions may be used for one, two or three-person mixing environments.

Figure 4:
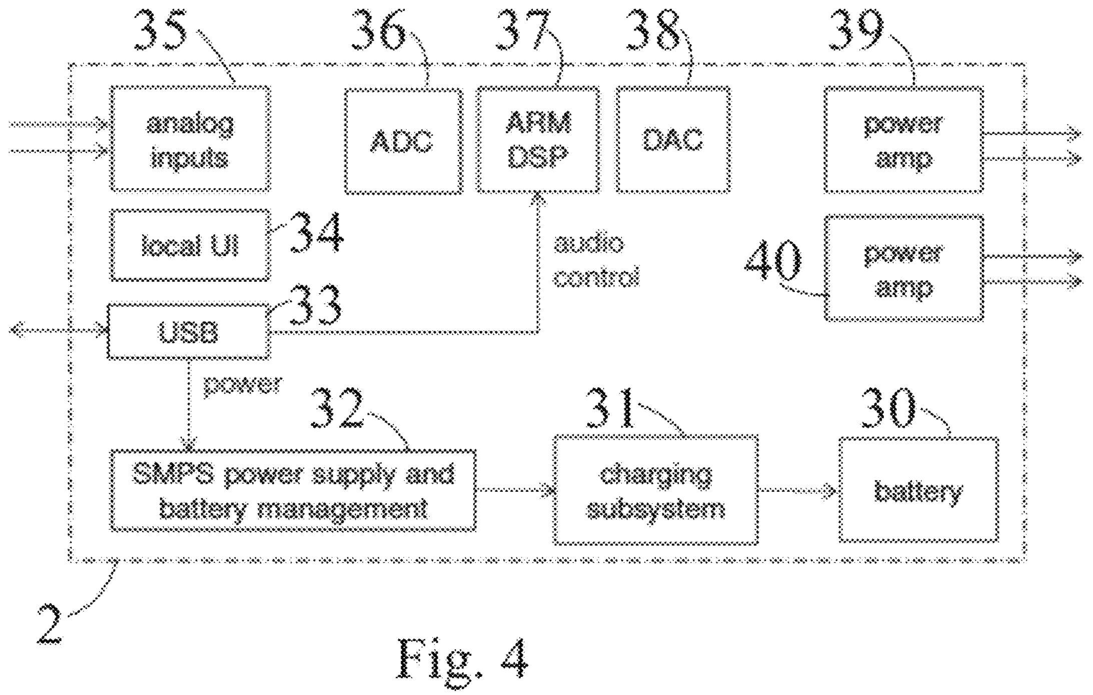
FIG. 4 illustrates as a block diagram one embodiment of electronics in accordance with the invention.

From the software point of view this calibration could be presented in the following way:

- the calibration sets the sound of the Active Headphone 1 similar to that of the user's previously measured loudspeaker monitoring system
  - calibration process is the following:
  - user has the Active Headphone amplifier 2 connected to the computer 51 running the suitable software (like GLM)
  - user selects an existing system calibration
  - software selects the left and right monitor responses
  - software calculates the filter settings to render the sound in Active Headphone similar to that in the monitor loudspeakers
  - includes early reflections, sub-band decay, sound colour, and externalization filter settings
  - the user can listen to the equalization result and save these settings in the Active Headphone amplifiers memory permanently FIG. 4 illustrates an example apparatus capable of supporting at least some embodiments of the present invention. In accordance with FIG. 4 the headphone amplifier 2 includes analog inputs 35 for receiving analog audio signal. This signal is converted to digital form by analog-to-digital converter 36 and fed to digital signal processing block 37 after which the digital signal is converted back to analog form to be fed to power amplifiers 39 and 40 feeding the amplified signal to the drivers of the headphone 1. The headphone amplifier 2 includes also a local simple user interface 34, which can be a switch or turning knob with coloured signal lights or a small display. Further the headphone amplifier 2 include a USB-connector 33 capable inputting electrical power into power supply and battery management system 32, which feeds the power further to charging subsystem 31 and from there to the battery 30, which is used as a primary power source for the electronics of the headphone amplifier 2. The USB-connector 33 is used also as a digital input for the digital signal processing block 37.

FIG. 5 illustrates an example software system capable of supporting at least some embodiments of the present invention. In accordance with FIG. 5 the software includes a software module for AutoCal room equalizer 41 for handling the room calibrations, a software module for EarCal user equalizer 42 for creating customized equalizations for the headphone 1. Factory equalization module 43 stands for the factory equalization stored in the memory of the headphone amplifier 2, where each driver of the headphone is factory calibrated against a reference such that each headphone 1 headphone amplifier 2 pair leaving the factory produces audio signal with essentially similar sound attributes. In addition the software package includes software functionality for USB-interface functions 47, software interface (GLM) functions 48, memory management functions 49 and power and battery management functions 50.

Casual Headphone Use

Figure 6:
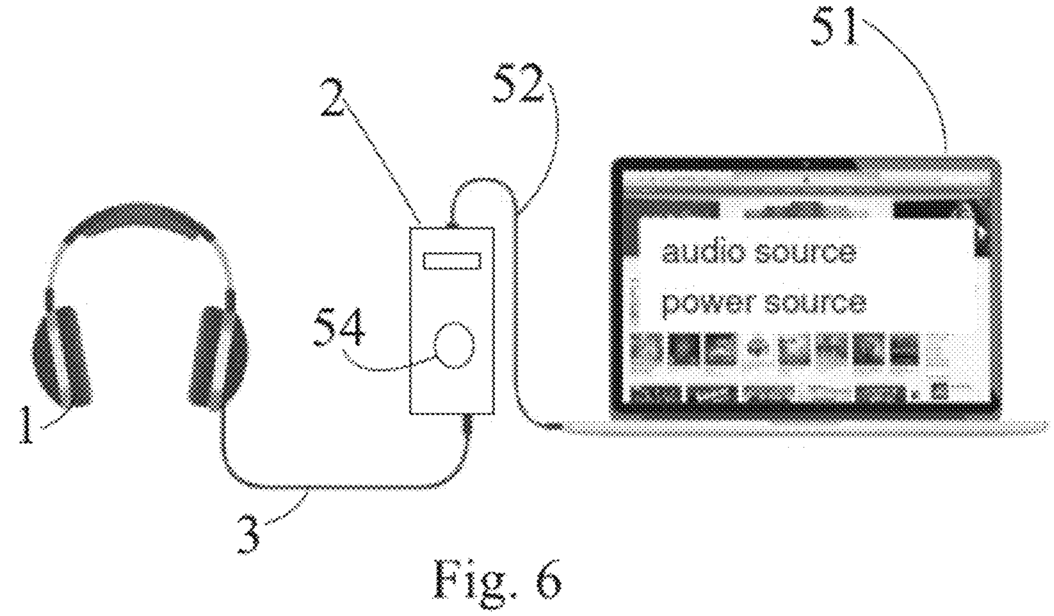
FIG. 6 illustrates first layout of the system in accordance with the invention.
Figure 7:
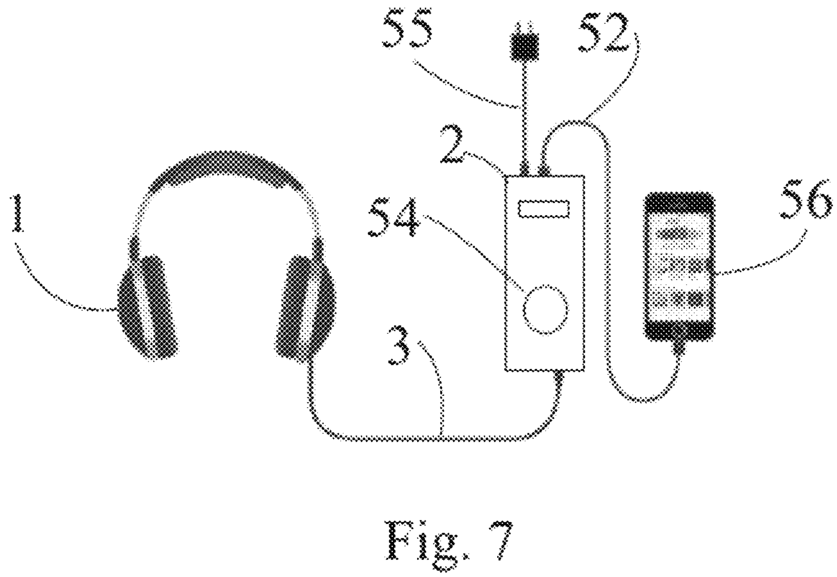
FIG. 7 illustrates second layout of the system in accordance with the invention.

In accordance with FIGS. 6 and 7 the Active Monitoring Headphone 1 is connected by a cable 3 to the headphone amplifier 2. The amplifier 2 is connected by a cable 52 to line outputs or monitoring outputs of a program source 51, 56. The program source may be portable device 56, professional or consumer, including computer platforms 51. User turns on Active Monitoring Headphone amplifier 2 and adjusts the signal attributes.

In accordance with some embodiments of the invention, like the FIG. 6 require attaching the headphone amplifier 2 to a computer USB connector and installing the suitable (e.g. GLM) software. The user navigates in the user interface to the 'headphone' page. Available options may be, for example:

- volume control with all associates dims, presets, etc.
- personal balance control (to set the sound image in the middle)
- sound character profile adjustment
- start-up volume set function
- ISS control function (how much time before sleep)
- max SPL limit function (protects hearing) on/off, limit adjustment
- EAI (enhanced LF isolation) on/off function as well as low/medium/high control for amount of isolation level (feedback)
- function to store these settings permanently into the Active Headphone amplifier Switching Between Calibrations When the user has stored calibrations in the Active Headphone amplifier, it is possible to select equalization referring to FIGS. 6 and 7. With a switch like Volume Control one of the calibrations may be selected e.g. in the following way: push the volume control 54 down (click) then turning the volume control selects the equalization (no eq or hedonistic eq is set, equalization method 1, equalization methods 2), then releasing the volume control selects the equalization.

Benefits of some embodiments of the invention in basic system quality in the following: Dedicated and individually equalized headphone amplifier 2 is included. Factory equalization eliminates unit-to-unit differences in the sound quality. There are no (randomly varying) unit-to-unit differences between the earphone cups, the balance is always maintained. The audio reproduction is always neutral unlike most other headphones. In addition the sound isolation is excellent (passive isolation by the close cup in mid/high frequencies, capability for improved isolation in bass frequencies). The room equalization (methods 1 and 2) allow emulation of the sound character of an existing monitoring system; for accurate and reliable work over headphones, for example when not in studio. The battery capacity and electronics design allow a full working day of operation without attaching the amp to a power source.

With the described embodiments several benefits can be obtained. The solution with the electronics in a separate amplifier module from the headphone enables (manual) volume control, there is no space limitation for batteries (power handling) or electronics. In this solution all needed input types and connections can be used. As well there is no limit to signal processing that can be included.

This solution can be powered from USB connector. Individual amplifying and cabling avoids any interaction between drivers which can happen for example, when the conductors are shared in the headphone cable. In active headphone signal processing can be made extremely linear. Each ear/driver in a headphone can be individually factory-equalized to a reference, therefore each driver can present a perfectly flat and neutral response. In case of a multi-way driver for each ear, the crossovers for the multi-way system can be made to have ideal performance. Customer calibration is possible. Hedonistic calibration is possible (e.g. preferred sound, response profile) as well as calibration of the headphone to sound the same as a reference system (for example, a listening room); this calibration can be automated.

Automatic Regularization Parameter for Headphone Transfer Function Inversion

A method is proposed for automatically regularizing the inversion of a headphone transfer function for headphone equalization. The method estimates the amount of regularization by comparing the measured response before and after half-octave smoothing. Therefore the regularization depends exclusively on the headphone response. The method combines the accuracy of the conventional regularized inverse method in inverting the measured response with the perceptual robustness of inversion using the smoothing method at the at notch frequencies. A subjective evaluation is carried out to confirm the efficacy of the proposed method for obtaining subjectively acceptable automatic regularization for equalizing headphones for binaural reproduction applications. The results show that the proposed method can produce perceptually better equalization than the regularized inverse method used with a fixed regularization factor or the complex smoothing method used with a half-octave smoothing window.

Binaural synthesis enables headphone presentation of audio to render the same auditory impression as a listener can perceive being in the original sound field. To place a virtual source presented over headphones in a specific direction, an anechoic recording of the source sound is convolved with filters that represent the acoustic paths from the intended source position to the listener's ears. These filters are known as binaural responses. In the case of anechoic presentation these responses are known as head related impulse responses (HRIR). In the case of reverberant presentation these are called binaural room responses (BRIR). The binaural responses can be obtained by measurement at the listener's auditory canals, at the auditory canals of a binaural microphone (artificial head), or by means of computer simulation. To maintain the spectral features of binaural responses, the headphone transfer function (HpTF) must be compensated when audio is presented over headphones. This is done by convolving the binaural responses with the inverse of the headphone response measured at the same position. Better results can be achieved when the responses are measured individually for each listener.

Figure 8:
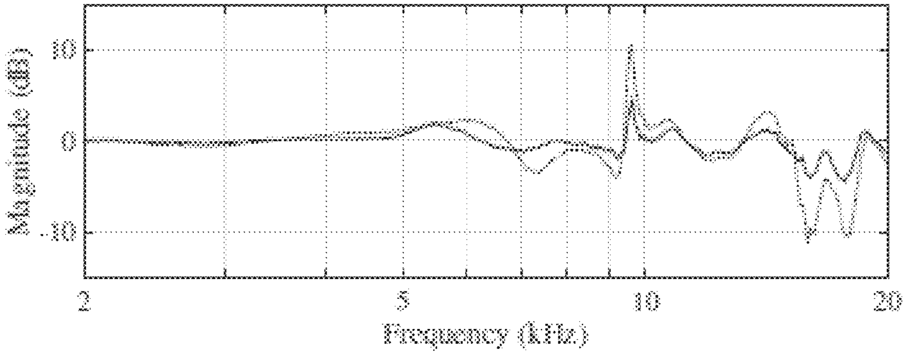
FIG. 8 illustrates the effect of repositioning on the equalization of a headphone. The inverse filter of headphone responses using Eq. 1 are used to compensate two responses measured after repositioning the headphones. There are no noticeable differences for frequencies below 2 kHz.

The headphone transfer function typically contains peaks and notches due to resonances and scattering produced inside the volume bound by the headphone and the listener's ear. Direct inversion of the complex frequency response of a headphone $$H^{-1}(\omega) = \frac{1}{H(\omega)} \tag{1}$$

contains large peaks at the frequencies where the measured response has notches. The peaks and notches seen in a headphone transfer function measurement vary between individuals, and also may change when the headphone is taken off and then put on again for the same subject. Although variability of the headphone transfer function due to repositioning of the headphone is reduced if the subject places the headphones himself, the process of equalizing a headphone using direct inversion of the headphone transfer function may result in coloration of the sound. Moreover, large peaks produced by applying exact inversion of deep notches may be perceived as resonant ringing artifacts when the notch frequency shifts due to repositioning of the headphone and the equalizer boost no longer matches the frequency and gain of the notch in the actual response. This effect is illustrated in FIG. 8, where two magnitude responses of a headphone measured after repositioning have been compensated using direct inversion of the response measured before repositioning. The narrow band resonances seen in responses shown in FIG. 8 are the result of mismatches between the notch frequencies in the responses used for inversion and in the responses measured after repositioning the headphone. Audibility of such mismatches can be minimized by limiting the gains of peaks resulting from inverting notches in the measured response.

To minimize the audible effects of notch inversion, perceptually motivated modifications to directly inverting the measured response have been commonly adopted.

Since humans perceive better peaks than notches of same magnitude and Q-factor, inversion should be done such that peaks in the measured response are inverted while notches are ignored or their magnitudes are reduced before inversion. The methodology employed in reducing the notch magnitude prior to inversion includes smoothing the measured response, averaging across several responses taken with repositioning the headphones, or approximating the overall response using a statistical approach. However, these methods may affect the accuracy of the inversion for the remain of the response.

Regularization of the inversion is a method that allows accurate inversion of the response while reducing the effort of notch inversion. A regularization parameter defines the effort of inversion at specific frequencies, limiting inversion of notches and noise in the response. The regularization parameter must be selected such that it causes minimal subjective degradation of the sound. However, the suitable value of the regularization parameter depends on the response to be inverted and therefore the value must be selected for each inversion using listening tests.

In this work, a method is proposed for automatically obtaining a frequency-dependent regularization parameter when inverting the headphone responses for binaural synthesis applications. Performance of the proposed regularization is compared to the conventional regularized inverse, Wiener deconvolution, and complex smoothing method regarding the accuracy of the response inverse except for large notches and the stability of the equalization against headphone repositioning. A subjective evaluation is carried out using individualized binaural room responses to confirm the subjective performance of the proposed regularization.

The Regularized Inverse Applied to Headphone Equalization

A frequency-dependent regularization factor can be introduced in the inversion process to limit the effort applied in the inversion of the notches. The regularization factor consists of a filter B(ω), that is scaled by a scale factor, β. The regularized inverse, $H_{RI}^{-1}(\omega)$, of a response H(ω) is then expressed as $$H_{RI}^{-1}(\omega) = \frac{H^*(\omega)}{|H(\omega)|^2 + \beta|B(\omega)|^2} D(\omega), \tag{2}$$

where * represents the complex conjugate, |•| is the absolute value operator, and D(ω) is a delay filter introduced to produce a causal inverse $H_{RI}^{-1}(\omega)$.

The inversion is exact when $|H(\omega)|^2 >> \oplus|B(\omega)|^2$, whereas the effort of inversion is limited when $\beta|B(\omega)|^2 \geq |H(\omega)|^2$. The effect of regularization can be seen in FIG. 9, where the regularized inverse for β=0.01 and B(ω)=1 (solid line) produces an accurate inversion of the headphone response excluding the large resonances presented in the direct inversion (dotted line). Furthermore, since this method avoids inversion at frequencies where the magnitude is smaller than the regularization factor, frequencies outside the useful bandwidth of the headphone are not inverted, as seen for frequencies below 30 Hz.

The parameters β and B(ω) are usually selected to obtain minimal sound quality degradation while inverting accurately the response except for the narrow notches. Typically, B(ω) is defined based on evaluating the bandwidth needed for inversion with acceptable subjective quality, resulting for instance in inverting the third-octave smoothed version of the response, or using a high pass filter. Then, β is adjusted using listening tests in order to scale B(ω) for minimal degradation of sound quality. In S. G Norcross, G A. Soulodre, and M. C. Lavoie, "Subjective investigations of inverse filtering," J. Audio Eng. Soc, vol. 52, no. 10, pp. 1003-1028, 2004, regularized inversion of a loudspeaker response was evaluated using three different B(ω) filters: flat response, band-stop filter with cut frequencies at 80 Hz and 18 kHz, and inverting the third-octave smoothed response. Different values of β were then tested for each B(ω). Results of S. G Norcross, G A. Soulodre, and M. C. Lavoie, "Subjective investigations of inverse filtering," J. Audio Eng. Soc, vol. 52, no. 10, pp. 1003-1028, 2004 show that correct values of β depend on the response to be inverted and on the filter B(ω) selected for the regularization. Furthermore, a study on the performance of different methods for inverting a headphone response for binaural reproduction showed that adjustment of β by expert listeners also produces different outcome depending on B(ω). In their experiment, B(ω) was defined as the inverse of the octave smoothed response of the headphone response or as a high pass filter with cut-off frequency at 8 kHz. Nevertheless, headphone equalization obtained using the regularized inverse with regularization adjusted by expert listeners is perceptually more acceptable than the headphone equalization obtained using an inverse obtained using the complex smoothing method. Therefore, although B(ω) can be selected a priori, β should be adjusted depending on the response to be inverted, H(ω), and the regularization filter, B(ω).

Relation to Wiener Deconvolution

If the noise power spectrum, $|N(\omega)|^2$, is known, the term $\beta|B(\omega)|^2$ in Eq. (2) can be estimated as the inverse of the signal-to-noise ratio (SNR), $$SNR(\omega) = \frac{|H(\omega)|^2}{|N(\omega)|^2}. \tag{3}$$

This yields the Wiener deconvolution which provides the optimal bandwidth of inversion regarding the SNR. The Wiener deconvolution filter, $H_{RI}^{-1}(\omega)$, is obtained as $$H_{W1}^{-1}(\omega) = \frac{H^*(\omega)}{|H(\omega)|^2 + \frac{|N(\omega)|^2}{|H(\omega)|^2}} D(\omega). \tag{4}$$

Figure 9:
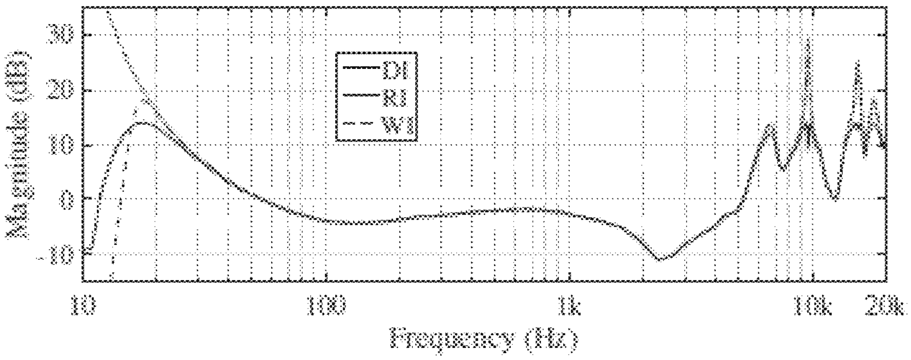
FIG. 9 illustrates an inverse of a headphone response using direct inversion (DI), regularized inverse with $\beta=0.01$ (RI), and Wiener deconvolution (WI).

For large SNR, Wiener deconvolution is equivalent to direct inversion but with optimal bandwidth for inversion, since only the bandwidth with large SNR is accurately inverted. This is illustrated in FIG. 9, where the inverse headphone response calculated using Wiener deconvolution (dashed line) is shown. Although this method provides an optimal bandwidth of inversion, notches are accurately inverted, producing large resonances in a similar manner to the direct inversion (dotted line), thus producing ringing artifacts. To avoid large resonances in the inverted response, a scale factor can be applied, rendering Wiener deconvolution equivalent to regularized inversion method (see Eq. 2).

Proposed Regularization

The term $\beta|\beta(\omega)|^2$ can be defined as a frequency-dependent parameter, $\hat{\beta}(\omega)$, such that the response is inverted accurately, but no inversion effort is desired for narrow notches and at frequencies outside the headphone bandwidth of reproduction. The parameter $\hat{\beta}(\omega)$ can be determined combining an estimation of the headphone reproduction bandwidth, α(ω), and an estimation of the regularization needed inside that bandwidth, σ(ω).

The parameter $\hat{\beta}(\omega)$ is then defined as $$\hat{\beta}(\omega) = \alpha(\omega) + \sigma^2(\omega) \tag{5}$$

The parameter α(ω) determines the bandwidth of inversion, which is defined as the frequency range where α(ω) is close or equal to zero. The new regularization factor, σ(ω) controls the inversion effort within the bandwidth defined by α(ω).

If the headphone bandwidth is known, α(ω) can be defined using an unity gain filter, W(ω), as $$\alpha(\omega) = \left(\frac{1}{|W(\omega)|^2} - 1\right). \tag{6}$$

The flat passband of W(ω) corresponds to the headphone bandwidth of reproduction, typically 20 Hz to 20 kHz for high quality headphones.

In a similar manner, if the noise power spectrum estimate is available, α(ω) can be defined as $$\alpha(\omega) = \frac{1}{SNR(\omega)} = \frac{|N(\omega)|^2}{|H(\omega)|^2}. \tag{7}$$

To avoid strong variation between adjacent frequency bins in the response, estimate of the noise envelope N(ω), e.g. a smoothed spectrum, should be used.

The new regularization factor, σ(ω), is defined as the negative deviation of the measured response, H(ω), from the response that reduces the magnitude of the notches, $\hat{H}(\omega)$. For instance, $\hat{H}(\omega)$ can be defined using a smoothed version of the headphone response. Based on this, σ(ω) can be determined as $$\sigma(\omega) = \begin{cases} |H(\omega)| - |\hat{H}(\omega)|, & \text{if } |\hat{H}(\omega)| \geq |H(\omega)| \\ 0, & \text{if } |\hat{H}(\omega)| < |H(\omega)| \end{cases}. \tag{8}$$

Figure 10:
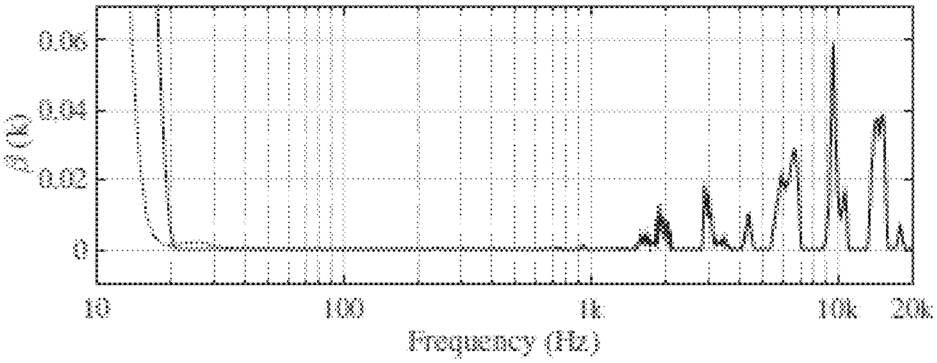
FIG. 10 illustrates values of the regularization parameter $\beta(\omega)$ for $\alpha(\omega)$ defined using Eq. 6 (solid line) and Eq. 7 (dotted line), and $\hat{H}(\omega)$ is a half-octave smoothed version of the headphone response.

Since $\sigma^2(\omega)>0$ for $|\hat{H}(\omega)|>|H(\omega)|$, $\hat{\beta}(\omega)$ the parameter contains large regularization values at notch frequencies that are narrower than the smoothing window. As an example, the $\hat{\beta}(\omega)$ obtained for the headphone response used in FIG. 9 is shown in FIG. 10. To obtain $\hat{\beta}(\omega)$, the parameter α(ω) is determined using Eq. 6, where W(ω) is selected such that it limits the bandwidth between 20 Hz and 20 kHz (solid line). In addition, α(ω) is also determined using Eq. 7 (dotted line), where N(ω) is estimated from the tail of the measured headphone impulse response. In both cases, $\hat{H}(\omega)$, is the half-octave smoothed version of the headphone response. The largest regularization values coincide with the frequencies of the resonances in the direct inverse seen in FIG. 9. The regularization parameter, $\hat{\beta}(\omega)$ remains close or equal to zero for the remainder of the response, allowing accurate inversion. The bandwidth limitation caused by α(ω) can be seen at frequencies below 20 Hz and above 20 kHz, where $\hat{\beta}(\omega)$ contains large values. When α(ω) is defined using Eq. 7 (dotted line), the inversion bandwidth extends slightly more to low frequencies and it is not limited at high frequencies, whereas using Eq. 6 the inversion bandwidth is limited between 20 Hz and 20 kHz as previously defined. For frequencies between 20 Hz and 20 kHz, $\hat{\beta}(\omega)$ is similar for both methods confirming that using either approach to determine α(ω) yields similar results.

Applying Eq. 5 to Eq. 2 yields the proposed modification of a conventional regularized inverse equation, sigma inversion $H_{SI}^{-1}(\omega)$ $$H_{SI}^{-1}(\omega) = \frac{H^*(\omega)}{|H(\omega)|^2 + \hat{\beta}(\omega)} D(\omega) = \frac{H^*(\omega)}{|H(\omega)|^2 + [\alpha(\omega) + \sigma^2(\omega)]} D(\omega). \tag{9}$$

Figure 11:
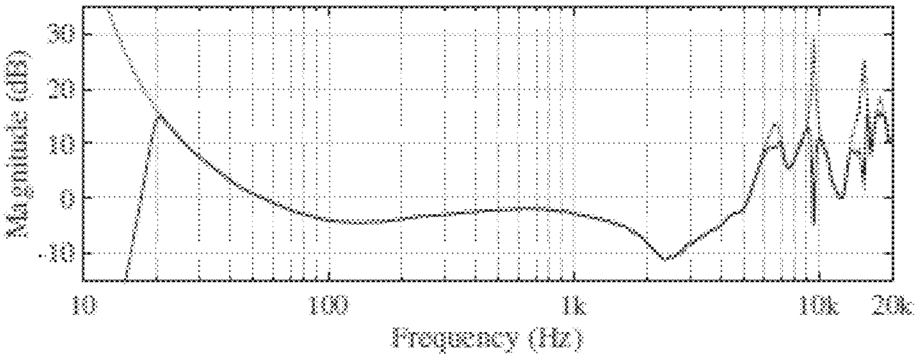
FIG. 11 illustrates an inverse of a headphone response using the direct inversion (dotted line) and the proposed sigma inversion method (solid line).

The proposed sigma inversion method is compared in FIG. 11 to the direct inversion of the headphone response used in FIG. 9. The parameter $\hat{\beta}(\omega)$ used to render $H_{SI}^{-1}(\omega)$ is that presented in FIG. 10 as a solid line. The resonances produced by an exact inverse of notches in the headphone response are not present in the inverse produced by the proposed method (solid line). Moreover, frequencies outside the defined bandwidth are not compensated and the other parts of the response are inverted accurately.

Apparatus and Methods

This section describes the measurement setup and signal processing performed in evaluating the performance of the proposed method. The evaluation measurements and design of the listening test are also explained.

Measurement Setup

Figure 12A:
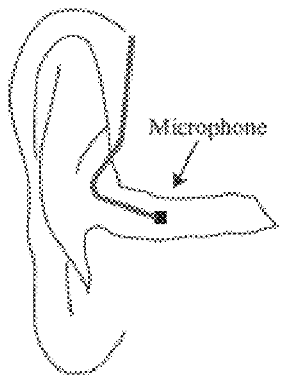
FIG. 12*a* illustrates a schematic view of a miniature microphone placed inside the open ear canal
Figure 12B:
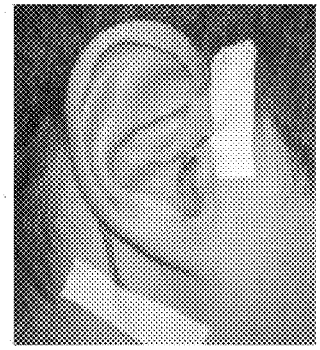
FIG. 12*b* illustrates a picture of microphone lead wires which are bent around the pinna and fixed with tape at two locations to avoid microphone displacement when placing the headphones.

The measurement setup consists of two miniature microphones (FG-23329, 0=2.59 mm, Knowles) placed inside the open auditory canals of human subjects and connected to an audio interface (UltraLite Hybrid 3, MOTU). The responses are digitized with 48 kHz sampling rate. The microphones are placed inside open auditory canals to avoid the effect of headphone load in binaural filters. The miniature microphones are introduced inside the auditory canal without reaching the eardrum but sufficiently deep so they remain in place when bending the lead wires around the ear (see FIG. 12*a*). Care is taken to ensure that the microphone does not move when placing the headphone over the ears by fixing the wires with tape at two positions as illustrated in FIG. 12*b*.

Normalization

Using a scale factor, g, the measured headphone response $H(\omega)$ is normalized to unit energy prior inversion such that $$\frac{1}{2\pi}\int_{-\pi}^{\pi}|gH(\omega)|^2 d\omega = 1. \tag{10}$$

This allows inversion to be centered in level at 0 dB, as can be seen in FIG. 9 and FIG. 11, avoiding discontinuities in the inverted response at frequencies outside the bandwidth of inversion when the magnitude of the response to be inverted is very small. After inversion, the response can be compensated for this scale factor, to restore the original signal gain. Moreover, this normalization allows the regularization to be defined as a dynamic limitation, e.g. $\beta$=0.01=−20 dB, if $B(\omega)$=1 within the bandwidth of inversion. Therefore, inversion of a normalized response does not create amplification of more than $|\beta|$−6 dB as seen in FIG. 9, where the conventional regularized inversion with $\beta$=0.01=−20 dB does not amplify by more than 14 dB.

Inverse Filters

Inverse filters for different methods are obtained using Eq. 9 by modifying the values of $\alpha(\omega)$ and $\sigma^2(\omega)$. The parameter values to obtain the inverse responses using Wiener deconvolution, conventional regularized inverse, complex smoothing, and the proposed sigma inversion regularization methods are shown in FIG. 13. To ensure the same bandwidth for all the methods used in this work, $\alpha(\omega)$ is defined using Eq. 6, where $W(\omega)$ has a constant unit gain between 20 Hz and 20 kHz. Wiener deconvolution uses Eq. 7 but the resulting bandwidth does not differ greatly from that of the other methods. The regularization scale factor $\beta$ is selected by adjustment using listening tests. Half-octave smoothing is used with the complex smoothing method and proposed sigma inverse method, to present a fair comparison between the methods. This smoothing window is selected based on informal listening tests. The half-octave smoothing produces the smallest sound degradation compared with octave, third-octave, and ERB smoothing windows.

The smoothed response, $H_{SM}(\omega)$, is implemented in the frequency domain using a half-octave square window, $W_{SM\_}$ starting at $\omega_1$ and ending at $\omega_2$ to separately smooth the magnitude $$|H_{SM}(\omega)| = \frac{1}{\omega_2-\omega_1}\int_{\omega_1}^{\omega_2} W_{SM}|H(\omega)|d\omega. \tag{11}$$

and the unwrapped phase $$\angle H_{SM}(\omega) = \frac{1}{\omega_2-\omega_1}\int_{\omega_1}^{\omega_2} W_{SM}\angle H(\omega)d\omega. \tag{12}$$

The smoothed response is obtained as $$H_{SM}(\omega)=|H_{SM}(\omega)e^{i\angle H_{SM}(\omega)}, \tag{13}$$

and the inverse, is then calculated using Eq. 9.

Performance Evaluation Measurements

The headphone (HD600, Sennheiser, Germany) worn by a single subject is measured four times, repositioning the headphone after each measurement. To reposition the headphone, the subject removes and then reapplies the headphone between measurements in order to reduce variability in the measured responses. The measured responses are normalized in magnitude around the 0 dB level. The resulting responses are presented in FIG. 14 to allow comparison between responses. The first headphone response (solid line) is used for inversion and it was also utilized to obtain the inverse responses illustrated in FIG. 9 and FIG. 11. A specific subject is chosen knowing from earlier informal measurements that his personal equalization filters produce ringing artifacts when inverted. The accurate inversion of the notch at 9.5 kHz is assumed to be the cause of the artifacts. The value of (3=−20 dB is selected for the conventional regularized inverse method based on an adjustment test carried out by the subject. The parameters for each method are given in FIG. 13.

Listening Test Design for Subjective Evaluation

A set of measurements is carried out to subjectively evaluate the proposed method. Headphone response (SR-307, Stax, Japan) and individual binaural room responses of a stereo loudspeaker setup (8260A, Genelec, Finland) inside an ITU-R BS.1116 compliant room are measured for each test participant. The measured headphone response is normalized before inversion and the gain factor is compensated after the inversion. This enables reproduction level over the headphones to match the sound level of the reproduction over the loudspeakers.

A listening test is designed to perceptually assess the performance of the proposed method. The paradigm of the test is to evaluate the fidelity of a binaurally synthesized presentation over headphones of a stereo loudspeaker setup. The aims is to evaluate the overall sound quality comparing to the loudspeaker presentation when headphone repositioning is imposed. The task for the subject is to remove the headphone, then listen to the loudspeakers, and finally put headphones on again to listen to the binaural reproduction. This causes the effect of repositioning during the test. The working hypothesis is that the proposed method performs statistically as good or better than the best case of the conventional regularized inverse and the smoothing method. This validates suitability of the proposed method.

The test signals used are a high-pass pink noise with cutoff frequency at 2 kHz, broadband pink noise, and two different music samples. The test signals have wide band frequency content. Therefore, high frequency artifacts and coloration can be detected. The noise signals consist of two uncorrelated pink noise tracks, one for each loudspeaker. The music signals are short stereo tracks of rock and funk music that can be reproduced seamlessly in a loop. To obtain the test samples, the test signals are convolved with the binaural filters obtained using the regularized inverse method, smoothing method, and the proposed sigma inverse method. The scale factor for the conventional regularized inverse, $\beta=-18$ dB, is selected with informal tests in which three listeners graded the sound quality obtained with different regularization $\beta$ values. The binaural filters without headphone equalization are used as the low anchor. These uncompensated filters are expected to distort the timbre and spatial characteristics of sound since the responses of the microphones inside the auditory canals and the headphone response are not equalized.

Ten subjects participated in the test. They have experience in similar tests requiring discrimination of timbral and spatial distortions. The subjects are asked to grade the fidelity of the headphone presentation of the audio samples using the scale from 0 to 100. The reproduction over the loudspeakers is used as reference. The subjects are instructed to give the maximum score only if they do not perceive any difference, and therefore cannot differentiate if the sound is coming from the loudspeakers or the headphone. The minimum score was to be given if the headphone reproduction does not reproduce any features of the loudspeaker presentation. These features to be evaluated are described to the subjects as timbre, spatial characteristics, and presence of artifacts. Nevertheless, the subjects have freedom to weight each feature differently, e.g. small differences in spatial reproduction could be graded more significant that differences in timbre. The test samples are reproduced in a continuous loop and the subject can freely select whether they listen to the loudspeaker or headphone reproduction. A graphic interface allows the subject to select between the four binaural filters and the loudspeaker reproduction. The binaural filters are ordered randomly for each test signal and comparison between filters is allowed.

Results

Evaluation of Performance

The suitability of the proposed regularization is assessed by comparison to the Wiener deconvolution, conventional regularized inverse and complex smoothing method.

The criteria for the comparison is the accuracy in the inversion of the response except for notches that may produce artifacts due to repositioning. The Wiener deconvolution and conventional regularized inverse methods are selected for the comparison because they feature similar equation to the proposed method differing only in the regularization parameter used (see above "THE REGULARIZED INVERSE APPLIED TO HEADPHONE EQUALIZATION). The Wiener deconvolution is also representing a direct inverse with optimal bandwidth limitation. The smoothing method is selected for comparison because smoothing of magnitude is used also in the proposed method to estimate the regularization parameter $\sigma^2(\omega)$ (see Eq. 8).

Figure 16:
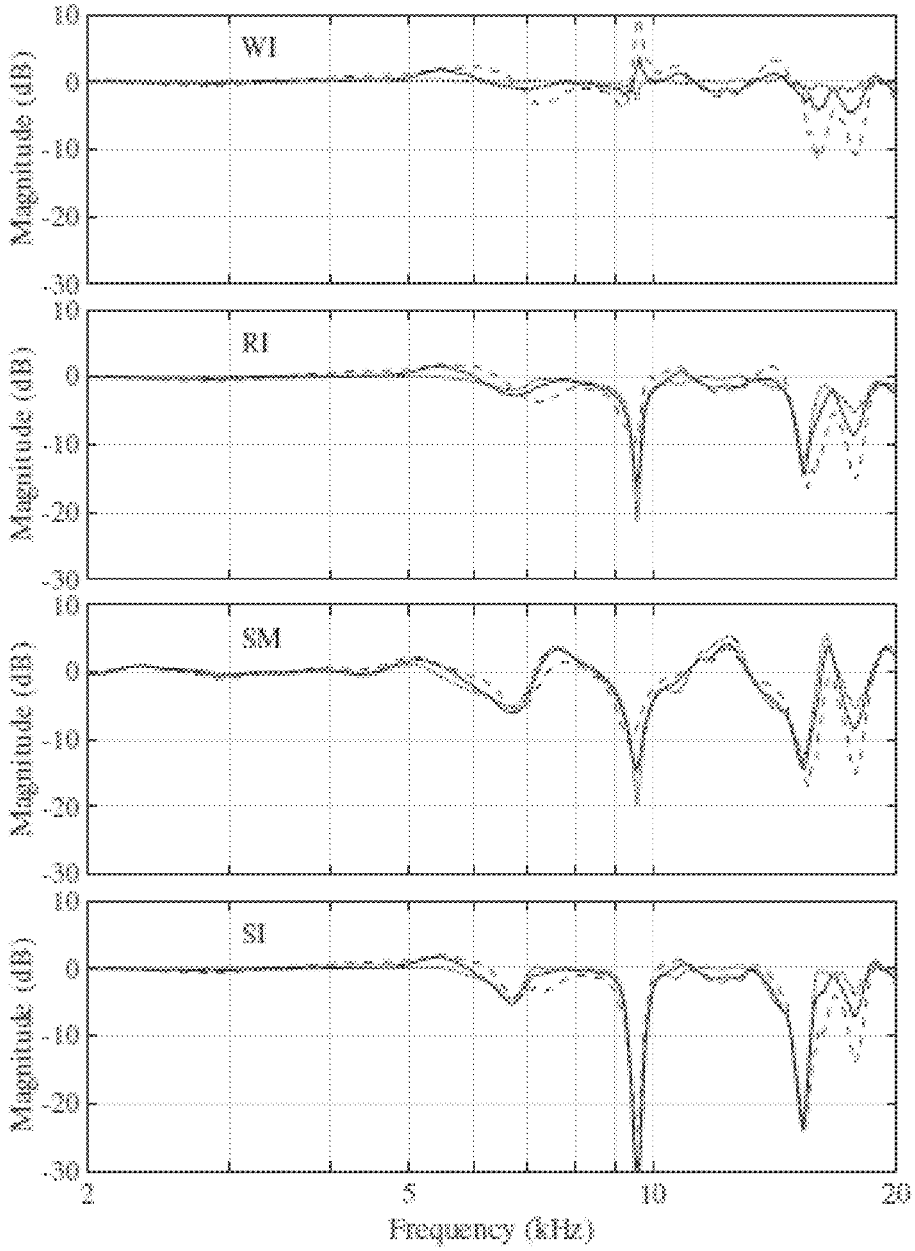
FIG. 16 illustrates the stability of the compensated response when repositioning the headphone three different times using the inverse filters obtained with the Wiener deconvolution (WI—top box), regularized inverse method (RI—second box from top), complex smoothing method (SM—third box from top), and proposed method (SI—bottom box). The compensated responses corresponding to the first, second, and third measurements are denoted as solid, dotted, and dashed lines respectively. There are no noticeable differences for frequencies below 2 kHz.

The headphone response, presented in FIG. 14 as a solid line, is utilized for obtaining the inverse filters using the aforementioned methods. The result of convolving the original response with the different inverse filters is shown in FIG. 15. The curves present data between 2 and 20 kHz where differences occur. The Wiener deconvolution (dotted line) produces a flat response inverting accurately the notches. The smoothing method (dashed line) produces resonances of 5 dB between notch frequencies, where the inversion is expected to be accurate. The conventional regularized inverse method (dash-dotted line) produces flatter response than the smoothing method while maintaining similar attenuation at notch frequencies. The proposed method (solid line) produces a compensated response with the largest attenuation at notch frequencies but still providing a flat response between notches. The strong attenuation at the notch frequencies suggests that small shifts in the notch frequency may not result in resonances when this inverse filter is applied to a headphone response measured after repositioning the headphone. An example of this effect can be seen in FIG. 16, presenting results of convolving the previously obtained inverted filter with three responses measured after repositioning. These responses with repositioning of the headphone are shown in FIG. 14 as dotted, dash-dotted and dashed lines. For all methods, above 16 kHz, the equalization of the response obtained with the third measurement differs up to 10 dB with respect to the original headphone response. However, this is not expected to influence the judgement greatly if broadband sound is reproduced. Therefore, the evaluation is performed for frequencies below 16 kHz. Although the headphone responses in FIG. 14 do not differ greatly, the equalized headphone responses in FIG. 16 using Wiener deconvolution (top box) contain resonances that can be perceived as ringing artifacts. These resonances are not experienced with the other methods, but some differences exist at these frequencies between the conventional regularized inverse (second box from the top), smoothing method (third box from the top), and proposed method (bottom box). The proposed method produces a stable, large attenuation at notch frequencies (9.5 kHz and 15 kHz) for all responses. This is not the case for the other methods. Their attenuation varies with repositioning. Furthermore, the proposed method still maintains a flat overall response similar to the conventional regularized inverse. These results suggest that the proposed method may add certain robustness against repositioning effects while maintaining a minimal sound degradation. However, this should be assessed by means of listening tests.

Subjective Evaluation

Figures 17, 18, 19:
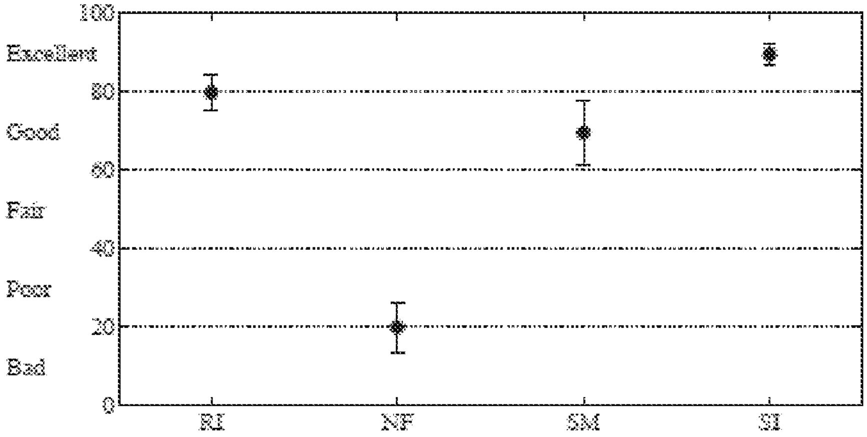
FIG. 17 illustrates a table showing mean score $\mu$ and standard deviation (SD) obtained across 10 subjects for each inversion method: No headphone equalization (NF), conventional regularized inverse (RI), smoothing method (SM), and proposed method (SI).
FIG. 18 illustrates atable showing p-values of the multi-comparison test using Games-Howell procedure. The methods are identified as: No headphone equalization (NF), conventional regularized inverse (RI), smoothing method (SM), and proposed method (SI).
FIG. 19 illustrates means and their 95% confidence intervals for the inversion methods calculated across 10 subjects. The methods are no headphone equalization (NF), conventional regularized inverse (RI), smoothing method (SM), and the proposed method (SI).

The sample means ($\mu$) and standard deviations (SD) estimated across the 10 subjects participating in the test are given in FIG. 17. To assess statistical significance of the differences between the means of the scores given to each method, a One-Way ANOVA test is carried out. The homogeneity of variances is tested using the Levene's test ($F(3, 156)=14.05$, $p<0.001$), resulting in a violation of the homogenity assumption. Therefore, a Welch's test with alpha=0.05 is used instead of conventional One-way ANOVA. The Welch's test reports statistically significant difference in at least one of the means scores given to the different methods ($F(3,79.48)=145.48$, $p<0.001$). A measure of the strength of association between the given scores and the inversion methods ($\omega^2=0.73$) indicates that 73% of the variance in the scores can be attributed to the inversion method. Since the homogeneity of variances is violated, the Games-Howell's post hoc test is used to determine which methods statistically differ in their mean score. The results of the test are given in FIG. 18. All of the methods show statistically significant differences between the score means except for the pair formed by the conventional regularized inverse ($\mu$=79.8, SD=14.33) and the smoothing method ($\mu$=69.92, SD=25.7) for which the null hypothesis cannot be rejected (p=0.139).

The means and their 95% confidence intervals are plotted in FIG. 19. The score mean and confidence interval of the conventional regularized inverse is better than that of the smoothing method, demonstrating a perceptually superior performance although the difference in the mean values is not statistically significant. This agrees with the results in Z. Schärer and A. Lindau, "Evaluation of equalization methods for binaural signals," in Audio Engineering Society Convention 126, May 2009 where $\beta$ was selected by expert listeners. Based on this, the value of $\beta$ used in the current test may be considered to agree with that obtained by experts and, therefore, be acceptable for assessing the performance of the proposed method. The proposed method presents the largest quality score mean, indicating the proposed method to cause smaller sound degradation than the other methods. Moreover, the confidence interval of the mean for the proposed method is narrow suggesting that the subjects agree about the scoring given to this method. These results confirm the hypothesis that the proposed method performs statistically better than the other methods used in this test.

Discussion and Concluding Remarks

An optimal regularization factor produces subjectively acceptable and precise inversion of the headphone response while still minimizing the subjective degradation of the sound quality due to the inversion of notches of the original measured headphone response.

Adjusting the regularization factor individually for the best subjective acceptance is tedious and time consuming since some frequency dependence may be expected. Approaches to define the regularization factor for inverting the headphone response are based on scaling a predefined regularization filter. The regularization filter is first designed to limit the bandwidth of inversion, then a fixed scale factor is adjusted to an acceptable value. Since the regularization factor depends of the response to be inverted, a fixed scale factor may cause certain notches to be over-regularized while others are not regularized sufficiently, and this degrades the sound quality.

The proposed method generates a frequency-dependent regularization factor automatically by estimating it using the headphone response itself. A comparison between the measured headphone response and its smoothed version provides the estimation of regularization needed at each frequency. This regularization is large at notch frequencies and close to zero when the original and smoothed responses are similar. The bandwidth of inversion can be defined from the measured response using an estimation of the SNR or a priori knowledge of the reproduction bandwidth. Therefore, the regularization factor can be obtained individually and automatically.

The smoothing window used for estimating the amount of regularization should cause minimal degradation to the sound quality. Narrow smoothing windows produce more accurate inversion of the headphone response because the smoothed response is more similar to the original data. However, this can cause a harsh sound quality due to excessive amplification introduced by inversion at frequencies around notches in the original measurement. A half-octave smoothing of the headphone response is found to estimate adequately the amount of regularization needed, but other smoothed responses obtained with different methods, like the one presented in B. Masiero and J. Fels, "Perceptually robust headphone equalization for binaural reproduction," in Audio Engineering Society Convention 130, May 2011, may also be suitable. Furthermore, different smoothing windows may be more optimal for certain purposes other than that analyzed in this work.

Evaluation of the proposed method indicates that it provides an inversion filter that can maintain the accuracy of the conventional regularized inverse method for inverting the measured response while limiting the inversion of notches in a conservative, subjectively acceptable manner. The regularization is stronger and spans a wider frequency range around the notches of the original response than the fixed regularization used in the conventional regularized inverse. This results in efficient regularization despite small shifts in the notch frequencies typical to repositioning the headphone, and causing smaller subjective effects, thus suggesting a better robustness against headphone repositioning. Based on the subjective test, the larger regularization caused by the proposed method does not seem to degrade the perceived sound quality.

The adjustment of the regularization factor for the conventional regularized inverse method is based on a subjective test carried out by only three subjects. Applying this single regularization for all the ten subjects may not have been optimal for some of them. However, the regularized inverse method obtained a good score ($\mu$=79.8, SD=14.33) and is generally graded better than the complex smoothing method ($\mu$=69.92, SD=25.7), which agrees with previous studies. This suggests that the regularization factor selected for the conventional regularized inverse method can be used as a reference for validating the efficacy of the proposed method in the subjective experiment.

The number of subjects is sufficient to observe the performance of the proposed method with respect to the conventional regularized inverse method. Strength of association measure ($\omega^2$=0.73) indicates that the subjective scores are mainly influenced by the inversion method and the post-hoc test shows that there are significant differences between the proposed method and the conventional regularized inverse method (p=0.002). Therefore, the score obtained by the proposed method is not by chance. The mean score obtained by the proposed method ($\mu$=89.62, SD=8.04) confirms the research hypothesis in the experiment. The hypothesis is that the proposed regularization of headphone response inversion is perceptually superior to using a fixed value regularization parameter and the result is subjectively robust against headphone repositioning.

The smaller standard deviation as well as the narrower confidence intervals of evaluation scores suggest that the subjects agree about the perceived sound quality produced by the proposed method. The effect of repositioning of the headphone during the test seems to affect less the score given to the proposed method than the scores of the reference methods.

The proposed method represents an improvement over the conventional regularized inverse. An important benefit of the proposed method is that the regularization is frequency specific, it causes the smallest sound quality degradation, and it is set automatically entirely based on the measured headphone response data.

The proposed method avoids the time needed for adjustment of the regularization factor for each subject individually, allowing faster and more accurate equalization of the headphone. The fidelity presented by the method in the subjective test suggests that the method can be used as a reference method for further research on binaural synthesis over headphones, or, as demonstrated by the listening test design, to simulate loudspeaker setups over headphones while maintaining the timbral characteristics of the original loudspeaker-room system.

Headphone Stereo Enhancement Using Equalized Binaural Responses to Preserve Headphone Sound Quality A criterion is described and evaluated for equalizing the output of binaural stereo rendering networks in order to preserve the sound quality of the headphone. The aim is to equalize the binaural filter so that the sum of the direct and crosstalk paths from loudspeakers to each ear has flat magnitude response. This equalization criterion is evaluated using a listening test where several binaural filter designs were used. The results show that preserving the differences between the direct and crosstalk paths of a binaural filter is necessary for maintaining the spatial quality of binaural rendering and that post equalization of the binaural filter can preserve the original sound quality of the headphone. Furthermore, post equalization of measured binaural responses was found to better fulfill the expectations of the test participants for virtual presentation of stereo reproduction from loudspeakers.

Introduction

Figure 20:
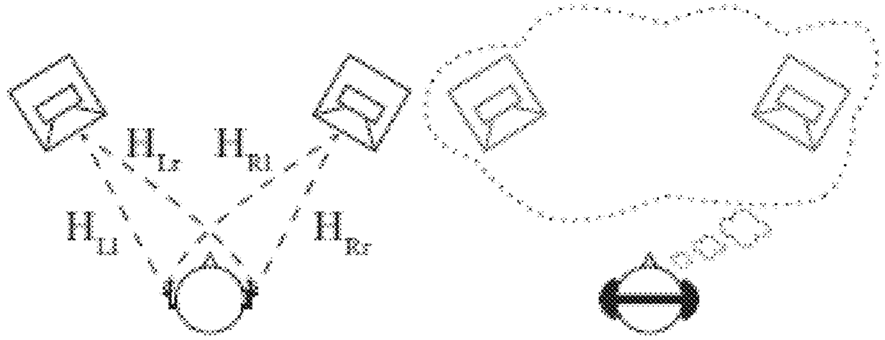
FIG. 20 illustrates a schematic view of binaural rendering of a loudspeaker stereo setup

A headphone is commonly used for stereo listening with portable devices due to portability and isolation from surroundings. The sound quality of a headphone is mainly influenced by its frequency response and several studies have proposed different target functions for designing a high sound quality headphone. This yield headphone designs that can provide excellent sound quality in stereo sound reproduction. However, reproduction of stereo signals over headphones is known to produce the auditory image between ears (lateralization) and to produce fatigue. This is caused by the difference of the binaural cues produced by headphones compared to those produced by stereo reproduction over loudspeakers. Stereo enhancement methods for headphone reproduction can artificially introduce binaural cues similar to those produced by loudspeakers by means of filtering. Binaural rendering of a stereo loudspeaker setup is illustrated in FIG. 20. The binaural responses from the loudspeakers to the ears are represented by the filters $H_{ij}(\omega)$ (uppercase subscripts "L" and "R" denote left and right loudspeakers and lowercase "1" and "r" denote left and right ears respectively). After convolving a stereo audio signal with these filters, an auditory image similar to that produced by a loudspeaker pair is reproduced while listening over the headphone.

Since the interaural time and level differences (ITD and ILD respectively) are the main cues for localization in the horizontal plane, filters that mimic the ITD and ILD of a stereo loudspeaker system can be used to reduce the lateralization effect. Furthermore, the spatial characteristics of stereo reproduction over headphones are improved by using head-related transfer functions, HRTFs, or binaural room responses, BRIRs, that approximate more accurately the real ITD, ILD, and monaural responses of the listener.

While binaural rendering has been extensively used in auditory localization research, however, sound quality assessment tests have shown that listeners prefer reproduction of stereo signals over headphones without enhancement methods. This can be due to spectral colorations that non-individualized binaural filters cause in the sound. To produce more "natural" sound using binaural filters, equalization of the HRTFs has been proposed. Using an expert listener to design post equalization of the binaural filters in order to match the binaural sound quality to the loudspeaker sound quality has been also studied. However, there is little research on preserving the original headphone sound quality when using binaural rendering.

Preserving the original sound quality of the headphone while enhancing the spatial characteristics of the auditory image motivates this work. In the present work, binaural filters are designed such that the phase information of the binaural room responses is preserved while the magnitude information is equalized in different manners. The aim of the design of these binaural filters is to enhance the spatial stereo image while minimizing degradation of the quality of the headphone sound. As in Kirkeby, O., "A Balanced Stereo Widening Network for Headphones," in Audio Engineering Society Conference: 22nd International Conference: Virtual, Synthetic, and Entertainment Audio, 2002 maintaining a flat magnitude response of the binaural stereo network output in order to obtain equal signal magnitude in both channels is the adopted as the criterion for preserving the headphone sound quality. The filters are evaluated by listening tests where the spatial quality, timbre/sound balance quality, and overall stereo presentation quality are tested separately.

Firstly, the criterion for preserving the headphone sound quality in binaural stereo rendering is presented. Secondly, the measurement, filtering methods and the design of the listening test for evaluation are described. Subsequently, the results of the listening test are presented and discussed. Next, concluding remarks are presented.

Criterion for Preserving Headphone Sound Quality in Stereo Binaural Rendering

Figure 21:
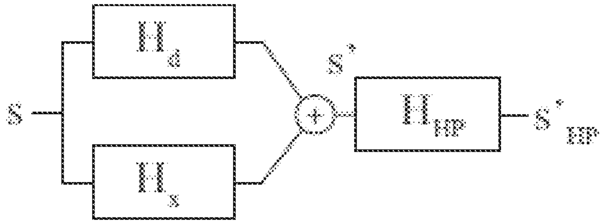
FIG. 21 illustrates a schematic view of binaural stereo reproduction over headphones of a phantom source placed at the center.
Figure 22:
FIG. 22 illustrates a schematic view of direct reproduction over headphones of a stereo signal of a phantom source placed at the center. Only one ear is shown.
Figure 23:
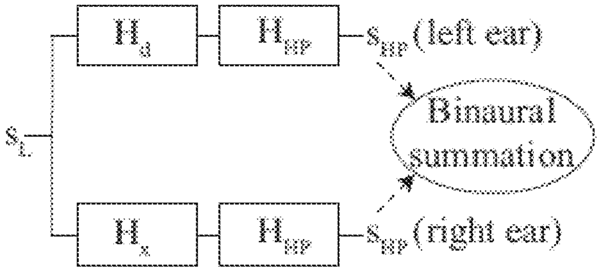
FIG. 23 illustrates a schematic view of binaural stereo reproduction over headphones a phantom source panned completely to the left.

In stereo mixing, phantom monophonic sources are placed in the center of the auditory image by equally distributing the signal between both channels. When applying binaural rendering to emulate loudspeaker stereo reproduction over headphones, each stereo channel is always processed by a pair of filters that represent the direct path from the loudspeaker to the ear in the same side of the head, $H_d$, and the crosstalk path from the loudspeaker at the opposite side of the head, $H_x$. The filter Hd is equivalent to $H_{Ll\_}$ and $H_{Rr}$, whereas $H_{x\_}$ is equivalent to $H_{Lr\_}$ and $H_{Rl\_}$ in FIG. 20. Binaural stereo reproduction over headphones of a phantom source placed in the center is illustrated in FIG. 21, where s is the audio signal, s' is the signal resulting after the binaural filtering process, His the transfer function of the headphone, and is the acoustic signal transmitted to the ear. Reproduction of the same signal, $s_{HP}'$ over headphones without binaural processing is illustrated in FIG. 22, where $s_{HP\_}$ is the resulting acoustic signal transmitted to the ear. We assume that there is symmetry between the paths from each loudspeaker to the ears, therefore the network presented in FIG. 21 is similar for both ears, Binaural stereo reproduction of a phantom source panned completely to the left is illustrated in FIG. 23. In this case, the audio signal is contained in the left channel of the stereo signal, $s_L$, whereas the right channel does not contain any signal. Since symmetry is assumed, the inverse arrangement pans the source entirely to the right.

In contrast to the network in FIG. 21, summation of signals is done inside the brain. This is known as binaural summation. The term "binaural summation" should be understood as the perceptual increment of perceived loudness between monotic reproduction of a signal (signal presented only into one ear) and diotic reproduction of the signal (signal presented into both ears). The increment in loudness has been found to depend on the reproduction level. However, we assume here that diotic presentation produces a gain of 6 dB in respect to monotic presentation since diotic presentation approximates the perceived gain at moderate levels. This is equivalent to the sum of two equal correlated signals. Since the filter $H_{x\_}$ is assumed to be the same for both ears, the network in FIG. 23 becomes equivalent to FIG. 21. This justifies the use of the systems in FIG. 21 to obtain an equalization that preserves the original sound quality of the headphone.

To preserve the headphone sound quality, the output of the binaural network, s', should approximate the input of the headphone when it is driven directly by the stereo signal for a centered phantom source (See FIG. 21). However, a filter $H_{EQ\_}$ that causes s'=s will remove all the binaural processing done for the spatialization. If the sound quality is defined in terms of magnitude response, then, the filter $H_{EQ\_}$ can be defined such that produces a signal s" whose magnitude response approximates the magnitude response of s. This means that $H_{EQ\_}$ should flatten the magnitude of the binaural network output. This filter can be designed as a linear filter with the magnitude response calculated as $$|H_{EQ}| = \frac{1}{|H_d + H_x|} \approx \frac{1}{|H_{SM}|}. \tag{14}$$

Figure 24:
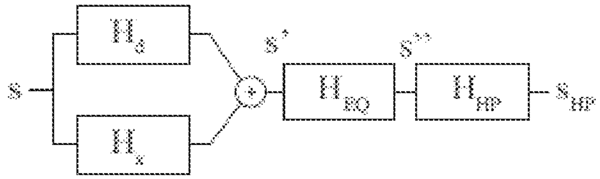
FIG. 24 illustrates a schematic view of binaural stereo reproduction over headphones with equalization of the response of a phantom source located at the center.

Since $H_{d\_}$ and $H_{x\_}$ may contain the effect of the room, a smoothed version of $|H_{d\_}+H_x|$, $|H_{SM}|$, may be desirable for the inversion. We used one octave wide smoothing window in this work. The binaural stereo reproduction network for preserving the headphone sound quality is illustrated in FIG. 24.

Methods

To evaluate the binaural stereo network for preserving the headphone sound quality, three binaural filters are designed and a listening test is carried out. Binaural room responses were used to add reflections that improve the externalization created by the filters.

Measurements and Filter Design

The binaural time responses of a dummy-head (Cortex Mk II), $h_{ij}(t)$, were measured for a stereo loudspeaker setup (Genelec 8260A) inside a listening room with 340 ms reverberation time. Using the measured responses, a set of binaural filters, $H_{bin}$, were designed by windowing the first 42 ms (2048 samples, 48 kHz sampling rate) of the responses, $$H_{bin}=\mathcal{F}\{h_{ij}(t)w(t)\}, i\in\{L,R\}, j\in\{l,r\}, \tag{15}$$

where $\mathcal{F}\{\bullet\}$ denotes Fourier transform, and w(t) is a 42 ms long time window. After performing informal listening tests this filter length was adopted as the best trade-off between the externalization capability and the timbral effects caused by the room reverberation.

The process described above was then applied to obtain a set of equalized binaural filters, $H_{binEQ}$. First, the average filter $H_{SM\_}$ was obtained using the binaural networks of both ears as $$|H_{SM}| = \frac{|H_{Rl} \,\hat{+}\, H_{Ll}| + |H_{Rr} \,\hat{+}\, H_{Lr}|}{2}, \tag{16}$$

where ^ denotes one octave smoothing process after the sum of the direct and crosstalk filters. The magnitude of the filter $H_{EQ\_}$ was obtained as the inverse of $|H_{SM}|$ between frequencies 50 Hz and 20 kHz. Then, the binaural filters $H_{bin}$ were convolved with $H_{EQ\_}$ to obtain the equalized binaural filters $H_{binEQ}$, $$H_{binEQ}=H_{bin}H_{EQ} \tag{17}$$

Further modification to the binaural filters to remove monaural cues was also performed. An all-pass version of $H_{bin\_}$ was generated by retaining only the phase information of the binaural filters. This preserves the temporal information in the filters but removes the ILD and monaural cues. Then, level differences between direct and crosstalk paths, $H_{LD}$, were estimated by averaging the resulting magnitudes obtained from the magnitude ratio between smoothed responses of the direct and crosstalk paths, $H_{LD}$, were estimated by averaging the resulting magnitudes obtained from the magnitude ratio between smoothed responses of the direct and crosstalk paths, $$H_{LD} = \frac{\left(\frac{\hat{H}_{Rl}}{\hat{H}_{Ll}} + \frac{\hat{H}_{Lr}}{\hat{H}_{Rr}}\right)}{2}, \tag{18}$$

where ^ denotes one octave smoothing of the filter magnitude response. After this, magnitude of the direct and crosstalk filters, $H_{d_{ph}}$ and $H_{x_{ph}}$ respectively, were designed as $$|H_{d_{ph}}| = \frac{1}{H_{LD}+1}, \quad |H_{x_{ph}}| = \frac{H_{LD}}{H_{LD}+1}. \tag{19}$$

Figure 25:
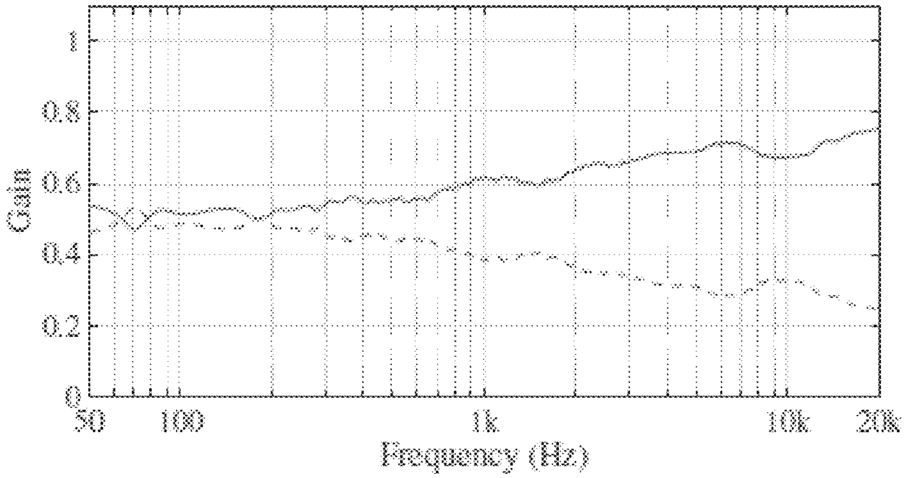
FIG. 25 illustrates gains introduced by filters $H_{d_{ph}}$ (solid line) and $H_{x_{ph}}$ (dashed line).

The frequency-dependent gains introduced by $H_{d_{ph}}$ (solid line) and $H_{x_{ph}}$ (dashed line) are presented in FIG. 25. The binaural all-pass filters were convolved with their corresponding $H_{d_{ph}}$ and $H_{x_{ph}}$ filters to generate the binaural filter $H_{ph}$, $$H_{ph} = \begin{cases} \arg\{H_{Ll}\} \times H_{d_{ph}} \\ \arg\{H_{Rl}\} \times H_{x_{ph}} \\ \arg\{H_{Lr}\} \times H_{x_{ph}} \\ \arg\{H_{Rr}\} \times H_{d_{ph}} \end{cases}, \tag{20}$$

where arg $\{\bullet\}$ denotes the argument (phase) of the filter. After this, an equalization filter was designed using Eq. 16 and Eq. 14, and the resulting filter was convolved with $H_{ph\_}$ to obtain an equalized binaural filter $H_{phEQ}$.

Figure 26:
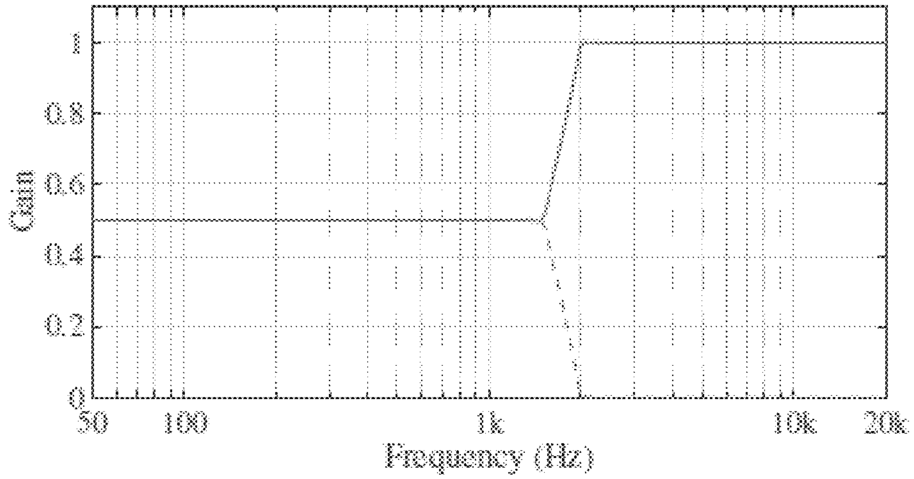
FIG. 26 illustrates gain introduced by the filters $H_{d_k}$ (solid line) and $H_{x_k}$ (dashed line) based on Kirkeby, O., "A Balanced Stereo Widening Network for Headphones," in Audio Engineering Society Conference: 22nd International Conference: Virtual, Synthetic, and Entertainment Audio, 2002.

In addition, the stereo loudspeaker setup was also measured in the listening room using an omnidirectional microphone (GR.A.S. Type 40DP) placed at 9 cm at the left and at the right of the listening position. The difference in time of arrival of the direct sound from one loudspeaker to each microphone position approximates the ITD obtained with the dummy-head. These responses were windowed to 42 ms and processed in a similar manner to $H_{phEQ}$, but the ILD was introduced by the direct and crosstalk filters proposed in Kirkeby, O., "A Balanced Stereo Widening Network for Headphones," in Audio Engineering Society Conference: 22nd International Conference: Virtual, Synthetic, and Entertainment Audio, 2002. These filters are denoted as $H_{d_k}$ and $H_{x_k}$ and their frequency responses are presented in FIG. 26. The resulting equalized binaural filters are denoted as $H_{oomEQ}$.

Figure 27:
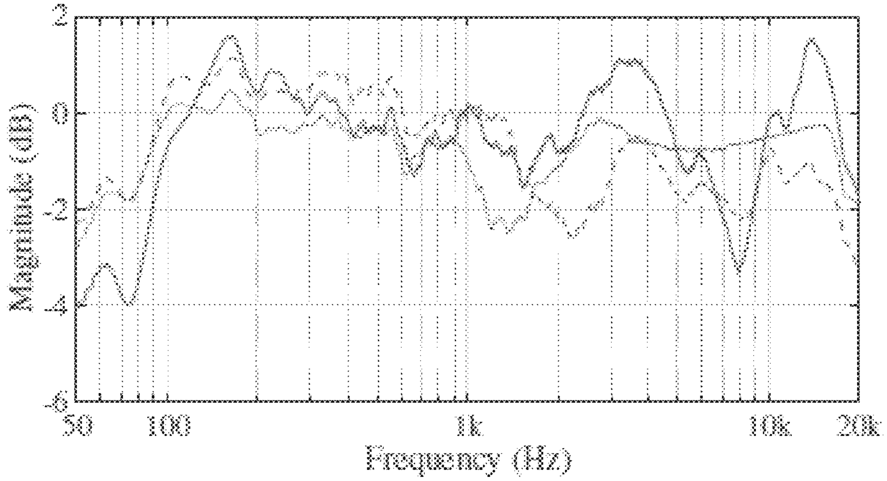
FIG. 27 illustrates one octave smoothed magnitude response of the equalized filters after summation of the direct and crosstalk paths at the left ear. Response for $H_{binEQ}$, $H_{phEQ}$, and $H_{roomEQ\_}$ are denoted as solid, dashed, and dotted lines respectively.

The responses of the filters $H_{binEQ}$, $H_{phEQ}$, and $H_{roomEQ\_}$ after summation of the direct and crosstalk filters (s" in FIG. 24) are shown in FIG. 27 for the left headphone channel. The deviations from a flat response are due to averaging between the ears in order to approximate symmetric filters and the smoothing window selected in the process.

Listening Test Design

A listening test consisting of three separate sections was designed to evaluate the spatial stereo quality, timbre/sound quality, and overall sound quality, respectively. The listening test was carried out using headphones exclusively (Stax SR-307) inside the room measured in the previous section. The cases to be evaluated were the direct reproduction of stereo signals over the headphones, and the binaural stereo reproduction using the binaural filters obtained after the processing described in section filterdesign, i.e. $H_{bin}$, $H_{binEQ}$, $H_{phEQ}$, and $H_{roomEQ}$. A lowpass filtered (3.5 kHz cut frequency) monophonic signal was introduced as the low anchor in the tests.

Four stereo music tracks were selected for the tests. Two stereo tracks were mixed by the first author with different instrument loops panned to various directions. The other two stereo tracks were short pieces of commercial music mixes (country and rock). These stereo tracks were convolved with each binaural filter and the resulting signals were reproduced in a seamless continuous loop using an graphical user interface controlled by the test participants. The graphical user interface allowed the participant to select the test cases and the reference as many times desired, and then to grade each test case using sliders using a numerical scale from 0 to 100. Quality descriptors (Bad, Poor, Fair, Good, and Excellent) were visible at the right side of the sliders. The participants were instructed to score the worst case as 0 and the best case as 100. The remaining cases should then be graded based on the percieved differences. This was valid for all tests.

The first test, denoted as Test 1, evaluates the spatial stereo quality of the different cases against the spatial stereo quality produced by a reference. The reference was $H_{bin}$, thus it was used as a hidden reference in Test 1. To participate in the test, the participant should perceive externalization when listening to the reference. Otherwise, the participant's data was not included in the analysis. In Test 1, the participant was instructed to avoid any effect that variation in timbre may cause on the perception of spatial features by focusing on localization, width, and distribution of the phantom sources in the auditory image.

In Test 2, the sound quality produced by each case was compared to a reference. The reference was direct reproduction of the stereo signals over the headphones. Thus, the test included a hidden reference. The participants were instructed to disregard the effects of spatialization while grading and focus on the loudness/timbre differences of the different phantom sources, sound balance, and sound artifacts.

Test 3 evaluates the different cases based on the overall sound quality when reproducing stereo sound. There was no reference in this test, but the participants were instructed to assume a virtual reference. This virtual reference was the participant's personal expectation about how stereo reproduction of music should sound if it was played over loudspeakers. For this test the participant should account for the spatial and timbre quality based in his personal expectations.

A total of 14 subjects, aged between 23 and 45 years old, participated in the test. One of the participants did not perceived externalization with the reference in Test\, 1. Therefore, his data was excluded from the analysis in all tests and the results were analyzed for the remaining 13 participants.

Results

The data was tested for normality using a $\chi^2$ goodnes-of-fit procedure. The normality assumption was violated by the scores obtained by $$H_{binEQ}(\chi^2(4.52)=13.22, p=0.01) \text{ in Test 1;}$$

$$H_{bin}(\chi^2(4.52)=10.75, p=0.0294) \text{ in Test 2; and by}$$

$$H_{binEQ}(\chi^2(2.52)=6.98, p=0.0304) \text{ and}$$

$$H_{roomEQ}(\chi^2(4.52)=12.11, p=0.0165) \text{ in Test 3.}$$

The data for the three listening tests was found to also violate the assumption of homogeneity of variance ($p=0.00206$, $p=2.8'7\times10^{-5}$, and $p=1.32'7\times10^{-11}$ for Test 1, 2, and 3 respectively). Therefore, a Friedman's non-parametric statistical analysis and two-tailed Wilcoxon signed-rank post-hoc test with Bonferroni correction were performed for the data obtained from each listening test.

Test 1: Spatial Quality

Figures 28, 29, 30:
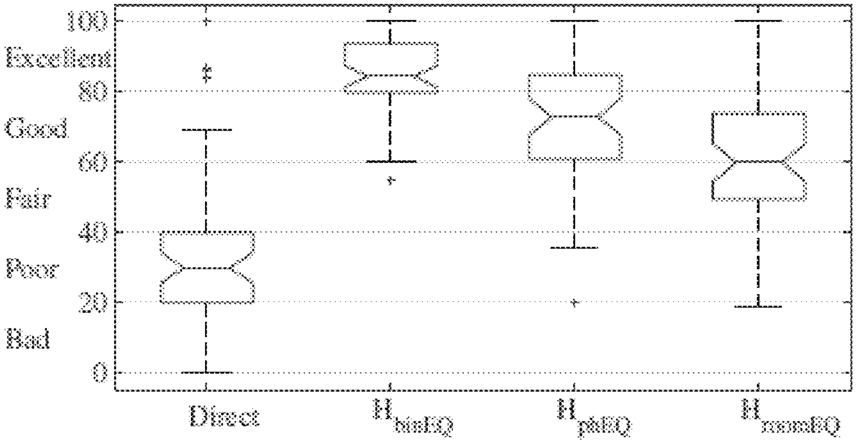
FIG. 28 illustrates a table showing results of the post-hoc test for the spatial quality test (Test 1). The low anchor was removed from the analysis. p-values smaller than $2\times10^{-3}$ are rounded to zero and larger than $\alpha=0.05$ are denoted in bold font.
FIG. 29 illustrates spatial quality test results. Quartiles and median of the scores obtained for each case in Test 1. Notches in the boxes denotes 95% confidence interval for the median. $H_{bin\_}$, was used as reference (Score=100)}
FIG. 30 illustrates a table showing results of the post-hoc test for the timbre/sound balance quality test (Test2). The low anchor was removed from the analysis. p-values smaller than $2\times10^{-3}$ are rounded to zero and larger than $\alpha=0.05$ are denoted in bold font.

Non-Parametric Analysis of the Data for Test 1 ($\chi^2(3)=107.06$, $p=4.69\times10^{-23}$) showed that the scores obtained by the different filters do not share the same distribution. Post-hoc tests confirmed that all cases differ (see FIG. 28). The median and quartiles of the pooled data are illustrated in FIG. 29. The direct reproduction of the stereo signals over headphones is denoted as Direct and the reference was $H_{bin}$. The reference and the low anchor are not shown in the figure since they are always 100 and 0 respectively. The notches in the boxes represent the 95% confident interval for the median and outliers are marked as crosses. The medians of each filter are ordered following a trend that coincides with degradation of the binaural information contained in $H_{bin}$. The filter $H_{binEQ}$, which contains the same interaural differences than $H_{bin}$, was found to reproduce the spatial characteristics of the reference better than $H_{phEQ}$, only containing the same phase than $H_{bin}$, and $H_{roomEQ}$, and with binaural information introduced artificially. The direct reproduction of the stereo signals over the headphones was found to reproduce poorly the spatial characteristics of the reference.

Test 2: Timbre/Sound Balance Quality

Figures 31, 32:
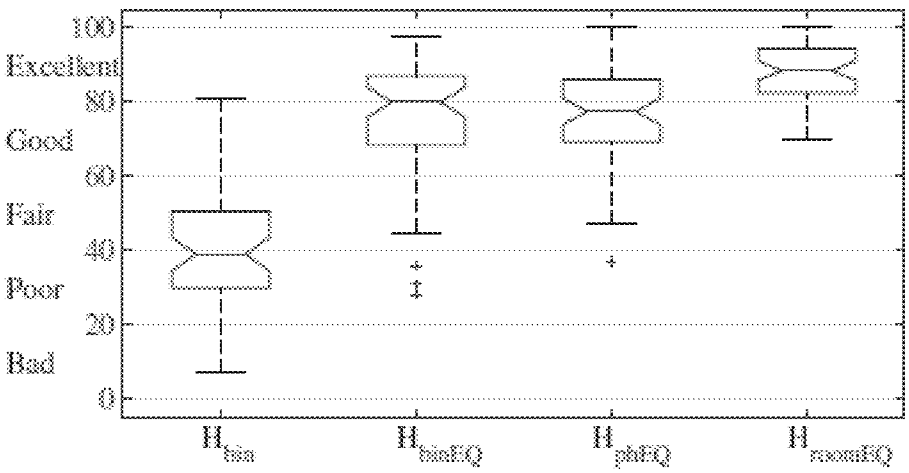
FIG. 31 illustrates timbre/sound balance quality test results. Quartiles and median representation of the scores obtained for each case in Test 2. Notches in the boxes denote the 95% confidence intervals for the median. Direct reproduction of stereo signals over the headphones was used as the reference (Score=100)}
FIG. 32 illustrates a table showing results of the post-hoc test for overall quality test (Test 3). The low anchor was removed from the analysis. p-values smaller than $2\times10^{-3}$ are rounded to zero and larger than $\alpha=0.05$ are denoted in bold font.

Non-parametric analysis ($\chi^2(3)=104.38$, $p=1.77\times10^{-22}$) found significant differences in the distributions of the scores obtained by the different cases. The results of the post-hoc test are presented in FIG. 30. The post-hoc test confirmed that the distribution of the data differs significantly between cases except for $H_{binEQ}$ and $H_{phEQ\_}$ ($Z=0.915$, $p=0.845$). This is also seen in FIG. 31, where $H_{binEQ}$ and $H_{phEQ}$ show similar distributions and similar confidence intervals for the median. In this test, the direct reproduction of the stereo signals over the headphones was used as reference. The scores for the different cases are ordered by the amount of magnitude distortion introduced by the filters. The direct and crosstalk filters used in $H_{roomEQ\_}$ are smooth and designed to produce a flat response, thus introducing less magnitude distortion. $H_{binEQ\_}$ contains the interaural differences of $H_{bin}$, however it is equally graded than $H_{phEQ}$, in which the interaural level difference is introduced artificially. Moreover, $H_{bin\_}$ is clearly outperformed by the other filters in this test, however $H_{binEQ\_}$ and $H_{phEQ\_}$ are relatively close to the scores of $H_{roomEQ}$. Comparing to the responses in FIG. 27, these results suggest that a smooth filter response may improve the timbre quality when compared to the direct reproduction over headphones. However, removing the monaural and ILD cues to produce a smoother filter, as in $H_{phEQ}$, did not improve the timbre quality in respect to $H_{binEQ}$, which contains the same binaural information than $H_{bin}$.

Test 3: Overall Quality

Significant differences were found between the distributions of the data in Test 3 ($\chi^2(4)=114.21$, $p=9.17\times10^{-24}$).

The post-hoc test results confirm that the scores of each case differ except for the pairs formed by the direct reproduction over headphones and $H_{bin\_}$ (Z=0.77, p=0.43) and the pair formed by $H_{binEQ\_}$ and $H_{phEQ\_}$ (Z=0.87, p=0.38). The results for the post-hoc test is presented in FIG. 32.

Figure 33:
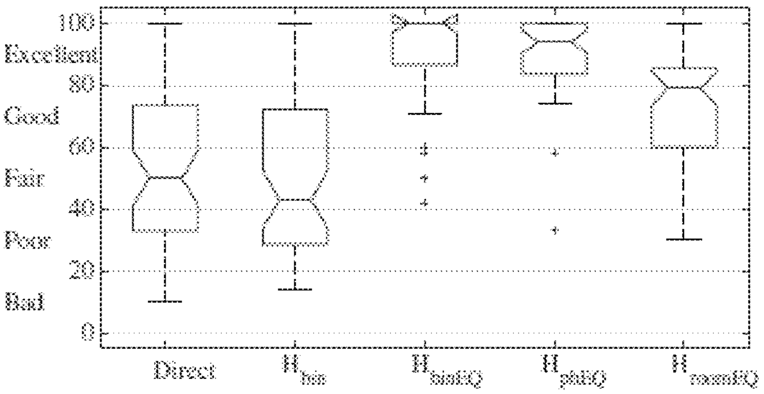
FIG. 33 illustrates overall quality test results. Quartiles and median representation of the scores obtained for each case in Test 3. Notches in the boxes denotes 95% confidence interval for the median.

Although the post hoc test found no difference between $H_{binEQ\_}$ and $H_{phEQ}$, the boxplot in FIG. 33 shows a slightly higher scoring for $H_{binEQ}$. Binaural filters with post equalization (denoted with subscript EQ) outperform the scores obtained by the direct reproduction over headphones and $H_{bin}$. The similar distribution for the direct stereo reproduction and $H_{bin\_}$ suggests that the participants penalized similarly the lack of spatial impression and the timbre distortion. These results differed from those obtained in Lorho, G, Isherwood, D., Zacharov, N., and Huopaniemi, J., "Round Robin Subjective Evaluation of Stereo Enhancement System for Headphones," in Audio Engineering Society Conference: 22nd International Conference: Virtual, Synthetic, and Entertainment Audio, 2002, which may be related to the selection of a virtual reference (loudspeaker setup) instead of an abstract definition of sound quality.

Concluding Remarks

This study focuses on the use of binaural filters to reproduce the spatial impression of a loudspeaker stereo pair while preserving the original headphone sound quality. A criterion for preserving the original sound quality of the headphones in binaural rendering of loudspeaker stereo reproduction is defined and evaluated. A post equalization filter is designed such that it flattens the output of the summation of the direct and crosstalk paths from the loudspeakers to each ear. This differs from other equalization methods where the ipsilateral and contralateral HRTFs are modified for the desired directions. The proposed equalization method shares the concepts presented in Kirkeby, O., "A Balanced Stereo Widening Network for Headphones," in Audio Engineering Society Conference: 22nd International Conference: Virtual, Synthetic, and Entertainment Audio, 2002 but is generalized here to using binaural room responses. Measured binaural room responses (42 ms) were used to design a binaural filter, allowing few early reflections while avoiding excessive timbral effects due to the reverberation. Modified binaural filters are designed such that the some original binaural attributes are smoothed or substituted by artificial binaural information. The aforementioned criterion is used to design post equalization filters that are applied to flatten the sum of the direct and crosstalk filters of the different binaural filters. A listening test is carried out to evaluate the performance of the binaural filters in terms of spatial quality, timbre/sound balance quality, and overall quality. The results show that preserving the differences between the direct and crosstalk paths of the original binaural filter is necessary in order to maintain the spatial quality of binaural rendering and that post equalization of such binaural filter still preserves the sound quality of the headphones. When listeners are asked about their personal expectations on how stereo music reproduction should sound like, the designed filters are preferred against typical binaural rendering and typical stereo reproduction over headphones. This confirms the suitability of the presented criterion for preserving the sound quality of the headphone while enhancing the spatial stereo characteristics of the sound.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to one embodiment or an embodiment means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment. Where reference is made to a numerical value using a term such as, for example, about or substantially, the exact numerical value is also disclosed.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The verbs "to comprise" and "to include" are used in this document as open limitations that neither exclude nor require the existence of also un-recited features. The features recited in depending claims are mutually freely combinable unless otherwise explicitly stated. Furthermore, it is to be understood that the use of "a" or "an", that is, a singular form, throughout this document does not exclude a plurality.

INDUSTRIAL APPLICABILITY

At least some embodiments of the present invention find industrial application in sound reproducing device sand system.

Some aspects of the invention are presented in the following paragraphs.

Paragraph 1. A method for calibrating a stereo headphone (1) including an amplifier (2) with a memory and signal processing properties, the method comprising steps for calibrating each driver or ear cup of the headphone (1) against a set reference ear cup or driver and storing the calibration settings in the memory of the amplifier (2).

Paragraph 2. A method in accordance with claim 1, wherein desired sound attributes for the headphone (1) are determined by setting signal processing parameters in the amplifier (2) in order to obtain the desired sound attributes based on the received input information from a user of the headphones (1).

Paragraph 3. A method in accordance with claim 1 or 2, wherein it includes a step for calibrating at least magnitude response, typically frequency response (including phase response) (factory calibration).

Paragraph 4. A method in accordance with any preceding claim or their combination, wherein the sound attributes include at least one of the following features: "frequency response", "temporal response", "phase response" or "sensitivity".

Paragraph 5. A method in accordance with any preceding claim or their combination, wherein the desired sound attributes like frequency response is determined based on calibration parameters of a loudspeaker system for a specific room.

Paragraph 6. A method in accordance with any previous method claim, wherein a. a test signal is reproduced by loudspeakers through a first sub-band ($B_1$), a. the testsignal is reproduced by headphones (1) through the first sub-band ($B_1$), b. evaluating the sound attributes like sound level of the test signal reproduced by the headphones (1) through the first sub-band ($B_1$) with the test signal reproduced by the loudspeakers through the first sub band ($B_1$) and setting and storing the sound attributes like sound level of the headphones to be essentially the same as in the loudspeakers at the sub-band $B_1$, c. repeating the above procedure with the test signal through several sub-bands $B_1$-$B_n$.

Paragraph 7. A method in accordance with claim 4, wherein the test signal is pink noise.

Paragraph 8. A method in accordance with claim 6 or 7, wherein the test signal a music-like audio file including audio signals with wide spectrum content.

Paragraph 9. A method in accordance with any claim 6-8, wherein the duration of the test signal is 1-10 seconds.

Paragraph 10. A method in accordance with any claim 6-9, wherein the the test signal is repeated continuously.

Paragraph 11. An active stereo/binaural headphone system including headphones (1) with at least one driver for each ear cup and an amplifier (2) connected to the headphones (1) by a cable (3), the system (1, 2, 3) comprising:

b. ear cups, c. means for signal processing in the amplifier (2), d. each of the drivers driver or the ear cup of the headphone (1) is factory calibrated against a set reference like ear cup or driver and stored in a memory of the amplifier (2), e. means for storing at least two predefined equalization settings in the amplifier (2), and f. means for noise cancelling in frequencies below 200 Hz.

Paragraph 12. A system in accordance with claim 11 wherein the ear cups are covering ears completely, e.g., circumaural way.

Paragraph 13. A system in accordance with claim 11 or 12, wherein the reference is predetermined frequency response obtained by measurement or from reference driver or ear cup.

Paragraph 14. An active headphone system in accordance with any previous claim, wherein the headphones (1) and the headphone amplifier (2) are separate independent units connected to each other by a cable (3).

Paragraph 15. An active headphone system in accordance with any previous claim, wherein the headphones (1) and the headphone amplifier (2) are mechanically integrated and electrically connected to each other by a cable (3).

Paragraph 16. An active headphone system in accordance with any previous claim wherein each driver or ear cup of the headphone (1) is factory calibrated against a set reference ear cup or driver and stored in a memory of the amplifier (2), whereby the factory calibration makes all of the ear cups in the headphone system acoustically essentially the same, e.g. same response, same loudness based on set reference ear cup or driver.

Paragraph 17. An active headphone system in accordance with any previous claim wherein the headphone amplifier and the headphone constitute a unique pair based after the factory calibration.

Paragraph 18. An active headphone system in accordance with any previous claim wherein the transfer function of the loudspeakers is imported to the headphone system.

Paragraph 19. An active headphone system in accordance with any previous claim wherein the transfer function of the headphone system is exported to the loudspeaker system.

Paragraph 20. An active headphone system in accordance with any previous claim wherein the volume control is the same for the loudspeakers and the phones.

Paragraph 21. A computer program configured to cause a method in accordance with at least one of the previous method claims to be performed.

ACRONYMS LIST

IIR Infinite Impulse Response
FIR Finite Impulse Response
IR Impulse Response
ARM Adaptive Multi-Rate audio data compression scheme
GLM Genelec Loudspeaker Management
SPL Sound Pressure Level
ISS sleep control
EAI enhanced Low Frequency isolation

CITATION LIST

Non Patent Literature

Kirkeby, O., "A Balanced Stereo Widening Network for Headphones," in Audio Engineering Society Conference: 22nd International Conference: Virtual, Synthetic, and Entertainment Audio, 2002.

Lorho, G., Isherwood, D., Zacharov, N., and Huopaniemi, J., "Round Robin Subjective Evaluation of Stereo Enhancement System for Headphones," in Audio Engineering Society Conference: 22nd International Conference: Virtual, Synthetic, and Entertainment Audio, 2002.

B. Masiero and J. Fels, "Perceptually robust headphone equalization for binaural reproduction," in Audio Engineering Society Convention 130, May 2011

S. G. Norcross, G. A. Soulodre, and M. C. Lavoie, "Subjective investigations of inverse filtering," J. Audio Eng. Soc, vol. 52, no. 10, pp. 1003-1028, 2004

Z. Schärer and A. Lindau, "Evaluation of equalization methods for binaural signals," in Audio Engineering Society Convention 126, May 2009

REFERENCE SIGNS LIST

1 stereo headphone including drivers for both ears
2 headphone amplifier
3 headphone cable
30 battery
31 charging subsystem
32 SMPS power supply and battery management
33 USB input
34 local user interface
35 analog inputs
36 analog-digital conversion (ADC)
37 Adaptive Multi-Rate (AMR) and digital signal processing (DSP)
38 Digital-analog conversion (DAC)
39 Power amplifier
40 Power amplifier
41 Auto calibration module
42 Ear calibration module
43 factory equalizer/calibration
45 volume control
46 dynamics processor
47 USB interface functions
48 software interface
49 memory management
50 power and battery management
51 computer running the software
52 connector cable for user interface
54 control knob of the headphone amplifier
55 power cable
56 portable terminal
60 headphone improving elements
61 monitoring improving elements
$B_1$-$B_n$ audio sub-bands
$\Delta f$ bandwidth of a sub-band, typically one octave

The invention claimed is:

1. A method for calibrating a stereo headphone including comprising an amplifier with a memory and signal processing properties, the method comprising steps for:

electronically equalizing each ear cup driver of the stereo headphone against a set reference ear cup driver to render a driver system for each ear cup individually to have a response the same as the set reference ear cup response, and storing at least one equalization settings in the memory of the amplifier.

2. The method in accordance with claim 1, wherein desired sound attributes for the headphone are determined by setting signal processing parameters in the amplifier in order to obtain the desired sound attributes based on the received input information from a user of the headphones.

3. The method in accordance with claim 1, wherein the method further comprises a step for calibrating at least magnitude response, typically frequency response including phase response.

4. The method in accordance with claim 1, wherein desired sound attributes for the headphone are obtained by setting signal processing parameters in the amplifier, wherein the sound attributes include at least one of the following features: "frequency response", "temporal response", "phase response" or "sensitivity".

5. The method in accordance with claim 1, wherein desired sound attributes for the headphone are obtained by setting signal processing parameters in the amplifier, wherein the desired sound attributes are determined based on calibration parameters of a loudspeaker system for a specific room.

6. The method in accordance with claim 1, wherein:

a test signal is reproduced by loudspeakers through a first sub-band, the test signal is reproduced by headphones through the first sub-band, evaluating the sound attributes reproduced by the headphones through the first sub-band with the test signal reproduced by the loudspeakers through the first sub band and setting and storing the sound attributes to be essentially the same as in the loudspeakers at the subband, and repeating the above procedure with the test signal through several sub-bands.

7. The method in accordance with claim 6, wherein the test signal is pink noise.

8. The method in accordance with claim 6, wherein the test signal is an audio file comprising audio signals with wide spectrum content.

9. The method in accordance with claim 6, wherein the duration of the test signal is between 1 and 10 seconds.

10. The method in accordance with claim 6, wherein the test signal is repeated continuously.

11. An active stereo/binaural headphone system including comprising headphones with at least one driver for each ear cup, and an amplifier connected to the headphones by a cable, wherein each ear cup driver of the stereo headphone is electronically equalized against a set reference ear cup driver to render a driver system for each ear cup individually to have a response the same as the set reference ear cup response, and wherein at least one equalization settings is stored in a memory of the amplifier.

12. The system in accordance with claim 11, wherein the ear cups are configured to cover ears of a person completely in a circumaural way.

13. The system in accordance with claim 11, wherein the set reference ear cup driver's response is a predetermined frequency response obtained by measurement or from the set reference ear cup driver.

14. The system in accordance with claim 11, wherein the headphones and the headphone amplifier are separate independent units connected to each other by the cable.

15. The system in accordance with claim 11, wherein the headphones and the headphone amplifier are mechanically integrated and electrically connected to each other by the cable.

16. The system in accordance with claim 11, wherein each ear cup driver of the headphones is factory calibrated against the set reference ear cup driver and stored in the memory of the amplifier, whereby the factory calibration makes all of the ear cups in the headphone system acoustically essentially the same, e.g. having same response, same loudness based on the set reference ear cup driver.

17. The system in accordance with claim 11, wherein the headphone amplifier and the headphone constitute a unique pair after the factory calibration.

18. The system in accordance with claim 11, wherein a transfer function of the loudspeakers is imported to the headphone system.

19. The system in accordance with claim 11, wherein a transfer function of the headphone system is exported to the loudspeaker system.

20. The system in accordance with claim 11, wherein a volume control is the same for the loudspeakers and the headphones.

21. A non-transitory computer readable medium configured to cause a method for calibrating a stereo headphone including an amplifier with a memory and signal processing properties to be performed, the method comprising steps for:

electronically equalizing each ear cup driver of the stereo headphone against a set reference ear cup driver to render a driver system for each ear cup individually to have a response the same as the set reference ear cup response, and storing at least one equalization settings in the memory of the amplifier.

* * * * *